United States Patent
Tomiyama

(10) Patent No.: US 8,358,549 B2
(45) Date of Patent: Jan. 22, 2013

(54) SEMICONDUCTOR MEMORY DEVICE, MEMORY TEST METHOD AND COMPUTER PROGRAM FOR DESIGNING PROGRAM OF SEMICONDUCTOR MEMORY DEVICE

(75) Inventor: Hiroshi Tomiyama, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 227 days.

(21) Appl. No.: 12/788,914

(22) Filed: May 27, 2010

(65) Prior Publication Data

US 2010/0313085 A1 Dec. 9, 2010

(30) Foreign Application Priority Data

Jun. 4, 2009 (JP) ................................. 2009-135134

(51) Int. Cl.
 *G11C 7/00* (2006.01)
(52) U.S. Cl. .............. 365/201; 365/230.03; 365/230.06; 365/239; 714/718; 714/E11.145
(58) Field of Classification Search .................. 365/201, 365/230.03, 230.06, 239; 711/718, E11.145; 714/718, E11.145
See application file for complete search history.

(56) References Cited

U.S. PATENT DOCUMENTS

| | | | | |
|---|---|---|---|---|
| 5,923,599 A | * | 7/1999 | Hii et al. | 365/201 |
| 5,946,246 A | | 8/1999 | Jun et al. | |
| 8,127,149 B1 | * | 2/2012 | Nachenberg | 713/193 |
| 2007/0089003 A1 | * | 4/2007 | Whetsel | 714/726 |
| 2008/0126901 A1 | * | 5/2008 | Cheng et al. | 714/733 |

FOREIGN PATENT DOCUMENTS

| | | |
|---|---|---|
| JP | 10-83699 (A) | 3/1998 |
| JP | 10-187554 (A) | 7/1998 |
| JP | 11-45596 (A) | 2/1999 |
| JP | 2000-156078 (A) | 6/2000 |
| JP | 2004-178676 (A) | 6/2004 |

* cited by examiner

*Primary Examiner* — Fernando Hidalgo
(74) *Attorney, Agent, or Firm* — Foley & Lardner LLP

(57) ABSTRACT

A semiconductor memory device includes: a plurality of RAM macros; and a test control circuit configured to correlate the plurality of RAM macros with a plurality of memory test execution periods. The test control circuit outputs control signals to the plurality of RAM macros such that one RAM macro of the plurality of RAM macros is tested during one memory test execution period of the plurality of memory test execution periods, the one RAM macro being correlated with the one memory test execution period.

11 Claims, 18 Drawing Sheets

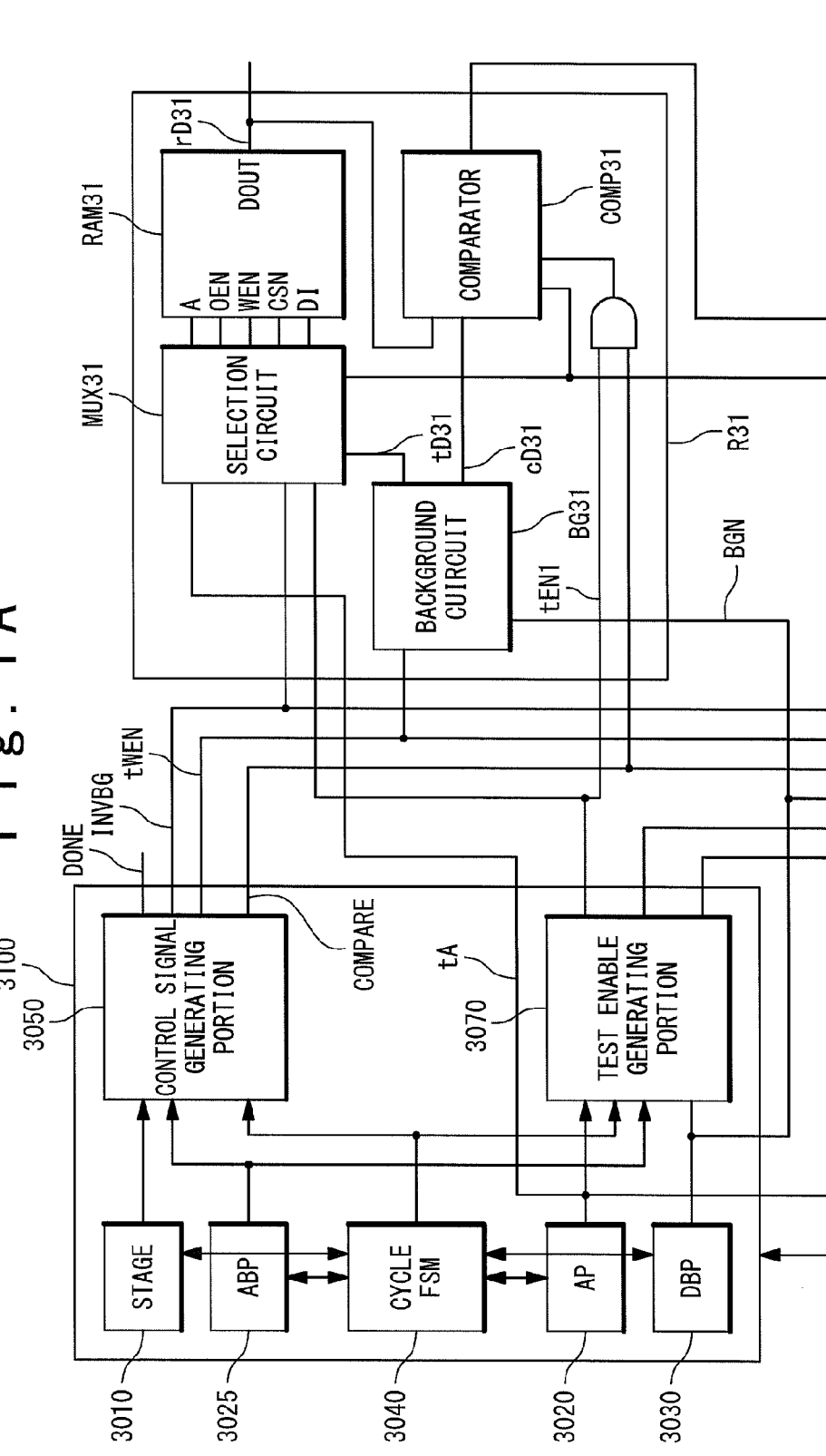

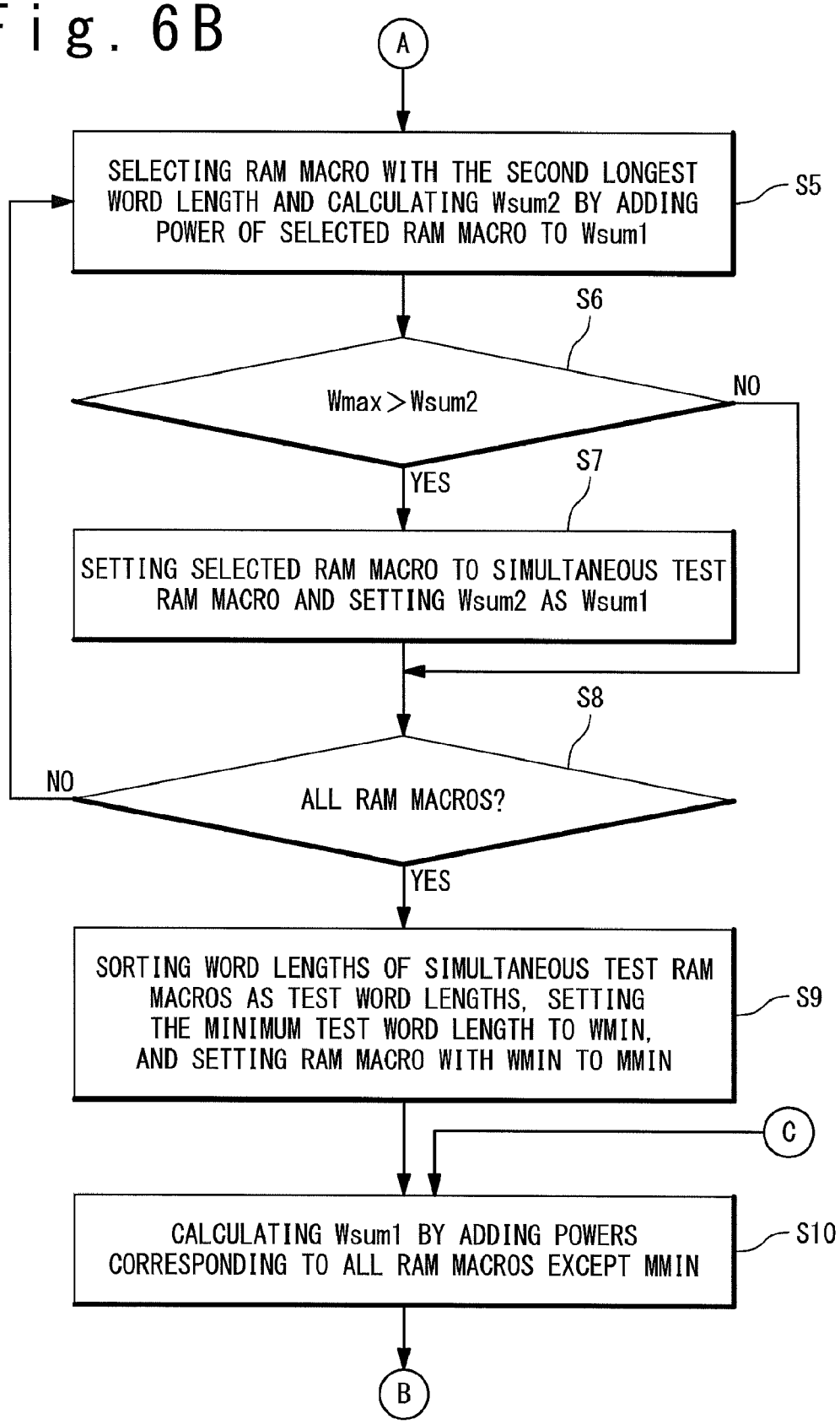

SEMICONDUCTOR MEMORY DEVICE, MEMORY TEST METHOD AND COMPUTER PROGRAM FOR DESIGNING PROGRAM OF SEMICONDUCTOR MEMORY DEVICE

INCORPORATION BY REFERENCE

This application is based upon and claims the benefit of priority from Japanese patent application No. 2009-135134 filed on Jun. 4, 2009, the disclosure of which is incorporated herein in its entirety by reference.

BACKGROUND OF THE INVENTION

1. Field of the Invention

The present invention relates to a semiconductor memory device, a memory test method and a computer program for a designing method of a semiconductor memory device. More particularly, the present invention relates to a semiconductor memory device and a memory test method for use in inspecting a plurality of macros by a self-test circuit, and a computer program for a designing method of the semiconductor memory device.

2. Description of Related Art

In the field of a semiconductor integrated circuit, a high-speed test is being increasingly demanded and required in order to address an increase of the degree of integration in accordance with finer processes, an increase of the capacity of built-in memory owing to higher functionality, and an increase of a test time owing to the improvement of test quality and other reasons.

Japanese Patent Publication No. JP2000-156078A discloses a semiconductor storage device having a function of writing data read from a specific bank into another bank, capable of reducing a data write time for a test, and having a multibank structure suitable for application to a synchronous DRAM or others. The semiconductor storage device having a multibank structure includes: a bank-to-bank data copy control circuit that specifies any one of a plurality of memory banks as a source bank based on a command for specifying a data copy mode between banks and performs control for writing data read from the source bank into at least one of the other memory banks.

Japanese Patent Publication No. JP2004-178676A discloses a semiconductor integrated circuit capable of suppressing an increase in gate scale required for inspecting a memory macro cell, performing inspection at a high operation frequency, and also reducing power consumption at the time of simultaneous inspection. The semiconductor integrated circuit has incorporated therein a plurality of memory macro cells with write data, an address and an access signal being taken as inputs and read data being taken as an output, determines the quality of the plurality of memory macro cells through write and read operations, and performs self inspection in terms of electric characteristics based on the quality determination. The semiconductor integrated circuit includes: the plurality of memory macro cells; a write data signal generating unit that generates the write data in any memory macro cell of the plurality of memory macro cells; and a data comparing unit that compares the write data and the read data of any memory macro cell of the plurality of memory macro cells. A read data output pin of any memory macro cell of the plurality of memory macro cells and a write data input pin of any memory macro cell other than the above-mentioned memory macro cell are sequentially connected together, the plurality of memory macro cells are connected in series. The write data signal generating unit, the plurality of memory macro cells, and the data comparing unit are connected in series. Based on the comparing result from the data comparing unit, the quality of the plurality of memory macro cells is determined.

Japanese Patent Publication No. JP-A-Heisei 10-83699 (corresponding to U.S. Pat. No. 5,923,599 (A)) discloses a memory device capable of inspecting a selected portion. The memory device includes: a semiconductor memory array; a component related thereto; and a self-inspection device including a device for inspecting the memory array and the related component and inspecting a selected sub-array of the semiconductor memory array.

Japanese Patent Publication No. JP-A-Heisei 10-187554 (corresponding to U.S. Pat. No. 5,946,246 (A)) discloses a semiconductor memory device having a self-test circuit capable of simultaneously testing many RAMs by sharing one controller for testing the built-in RAMs with varied sizes to minimize interconnection. The semiconductor memory device having a self-test circuit includes: a plurality of memory blocks; a plurality of selecting means adapted to select an address, a control signal, and data of the plurality of memory blocks as normal/test in response to a test mode signal; a plurality of background generating means that generates comparison data for comparison with data to be written in the plurality of memory blocks; a plurality of comparing means that compares the comparison data with the data read from the plurality of memory blocks in response to the test mode signal and outputs the comparison result; combining means that combines respective outputs from the plurality of comparing means to generate a test result, and test control means that provides a test address and a control signal to the plurality of selecting means, provides a background number and an output inverse control signal to the plurality of background generating means, and provides a comparison control signal to the plurality of comparing means, in response to the test mode signal.

Japanese Patent Publication No. JP-A-Heisei 11-45596 discloses a semiconductor integrated circuit capable of reliably performing a test with a simple circuit even when a plurality of built-in semiconductor storage circuits has varied storage capacities. The semiconductor integrated circuit includes: a plurality of semiconductor storage circuits with varied storage capacities; and a test circuit that performs an operation test for a plurality of semiconductor storage circuits. The test circuit includes: data signal generating means that generates data for writing data in the semiconductor storage circuit, expected-value data generating means that generates expected-value data; expected-data matching means that reads data from a data-written semiconductor storage circuit and determines whether the read data matches the data outputted from the expected-value data generating means; detecting means that detects a selection state of a specific word line of each of the semiconductor storage circuits; and an address signal generating unit that generates an address signal according to each of the semiconductor storage circuits based on a detection signal from the detecting means.

We have now discovered the following facts. FIGS. 1A and 1B show a known memory test circuit described in JP-A-Heisei 10-187554. The memory test circuit includes: a plurality of RAM blocks R31, R32, and R33; test control means (test control circuit 3100); and combining means G31. In this conventional technique, by way of example, the number of RAM blocks as a plurality of memory blocks is three. Hereinafter, each of the plurality of RAM blocks R31, R32, and R33 is represented as a RAM block R3n (n is 1, 2, or 3). The RAM block R3n includes a RAM macro RAM3n, a selection circuit MUX3n, a background circuit BG3n, and a comparator COMP3n. The selection circuit MUX3n selects an address, a control signal, and data of the RAM macro RAM3n as normal or test in response to a BISTMODE (Built-In-Self-Test MODE) signal 3500. The background circuit BG3n generates data to be written in the RAM macro RAM3n and data for comparison. The comparator COMP3n compares the comparison data with data read from the RAM macro RAM3n in response to the BISTMODE signal 3500, and outputs the comparison result. The test control means provides a test address tA and a test write control signal tWEN to the plurality of selection circuits MUX31, MUX32, and MUX33, and provides a test enable control signal tENn to the plurality of selection circuits MUX3n, in response to the BISTMODE signal 3500. The test control means further provides a background number BGN and an output inverse control signal INVBG to a plurality of background circuits BG31, BG32, and BG33, and provides a comparison control signal COMPARE to a plurality of comparators COMP31, COMP32, and COMP33. The combining means G31 performs logical OR on error signals from the plurality of comparators COMP31, COMP32, and COMP33 to generate the test result.

In an operation of the above-described memory test circuit, upon receiving the BISTMODE signal 3500, the test control circuit 3100 first generates a test address tA, a test write control signal tWEN, an output inverse control signal INVBG, a comparison control signal COMPARE, and a background number BGN. Then, upon receiving the background number BGN and the output inverse control signal INVBG, the background circuit BG3n generates write data tD3n and comparison data tC3n. Upon receiving the BISTMODE signal 3500, the selection circuit MUX3n supplies the test address tA, the test write control signal tWEN, the test enable control signal tEN, and write data tD3n to the RAM macro RAM3n. The RAM macro RAM3n performs a write operation and a read operation. The comparator COMP3n compares output data rD3n from the RAM macro RAM3n and comparison data cD3n. The combining means G31 combines the comparison results from the comparators COMP31, COMP32, and COMP33 to output an ERROR signal 3600.

In this technique, there is no function of controlling each test at each RAM block R3n, and the plurality of RAM blocks are simultaneously tested for reducing the testing time. Therefore, compared with the case of a normal operation in which an LSI implemented on a product performs an operation as an original LSI function (hereinafter simply referred to as a normal operation), a voltage drop in the test is increased. This prevents a test at an operating frequency of the normal operation, thereby causing an outflow of defective products not satisfying the operating frequency. One reason for this is as follows. LSI designing is performed with a power-supply impedance targeted for an operation current at the time of normal operation. However, at the time of the operation of the memory test circuit, all RAM blocks simultaneously operate, and therefore an operation current larger than that at the time of the normal operation flows to cause a voltage drop.

It is desired that a technique for preventing the occurrence of characteristic deterioration at the time of testing a plurality of RAM macros.

SUMMARY

The present invention seeks to solve one or more of the above problems, or to improve upon those problems at least in part.

In one embodiment, a semiconductor memory device includes: a plurality of RAM macros; and a test control circuit configured to correlate the plurality of RAM macros with a plurality of memory test execution periods, wherein the test control circuit outputs control signals to the plurality of RAM macros such that one RAM macro of the plurality of RAM macros is tested during one memory test execution period of the plurality of memory test execution periods, the one RAM macro being correlated with the one memory test execution period.

In another embodiment, a memory test method includes: obtaining a power table correlating a plurality of RAM macros with a plurality of powers; calculating a plurality of memory test execution periods correlated with the plurality of RAM macros based on the power table; and testing the plurality of RAM macros such that one RAM macro of the plurality of RAM macros is tested during one memory test execution period of the plurality of memory test execution periods, the one RAM macro being correlated with the one memory test execution period.

In another embodiment, a computer-readable medium including a computer program comprising code operable to control a computer for a designing method of a semiconductor memory device, the code includes: creating a power table correlating a plurality of RAM macros with a plurality of powers based on LSI designing data; calculating a plurality of memory test execution periods correlated with the plurality of RAM macros based on the power table; and designing a test control circuit controlling test for the plurality of RAM macros such that one RAM macro of the plurality of RAM macros is tested during one memory test execution period of the plurality of memory test execution periods, the one RAM macro being correlated with the one memory test execution period.

The semiconductor memory device and memory test method according to the present invention can prevent the occurrence of characteristic deterioration at the time of testing a plurality of RAM macros.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 1A is a block diagram showing a known semiconductor memory device described in JP-A-Heisei 10-187554;

FIG. 6B is a flowchart showing a part of the memory test method according to the present invention;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1B:
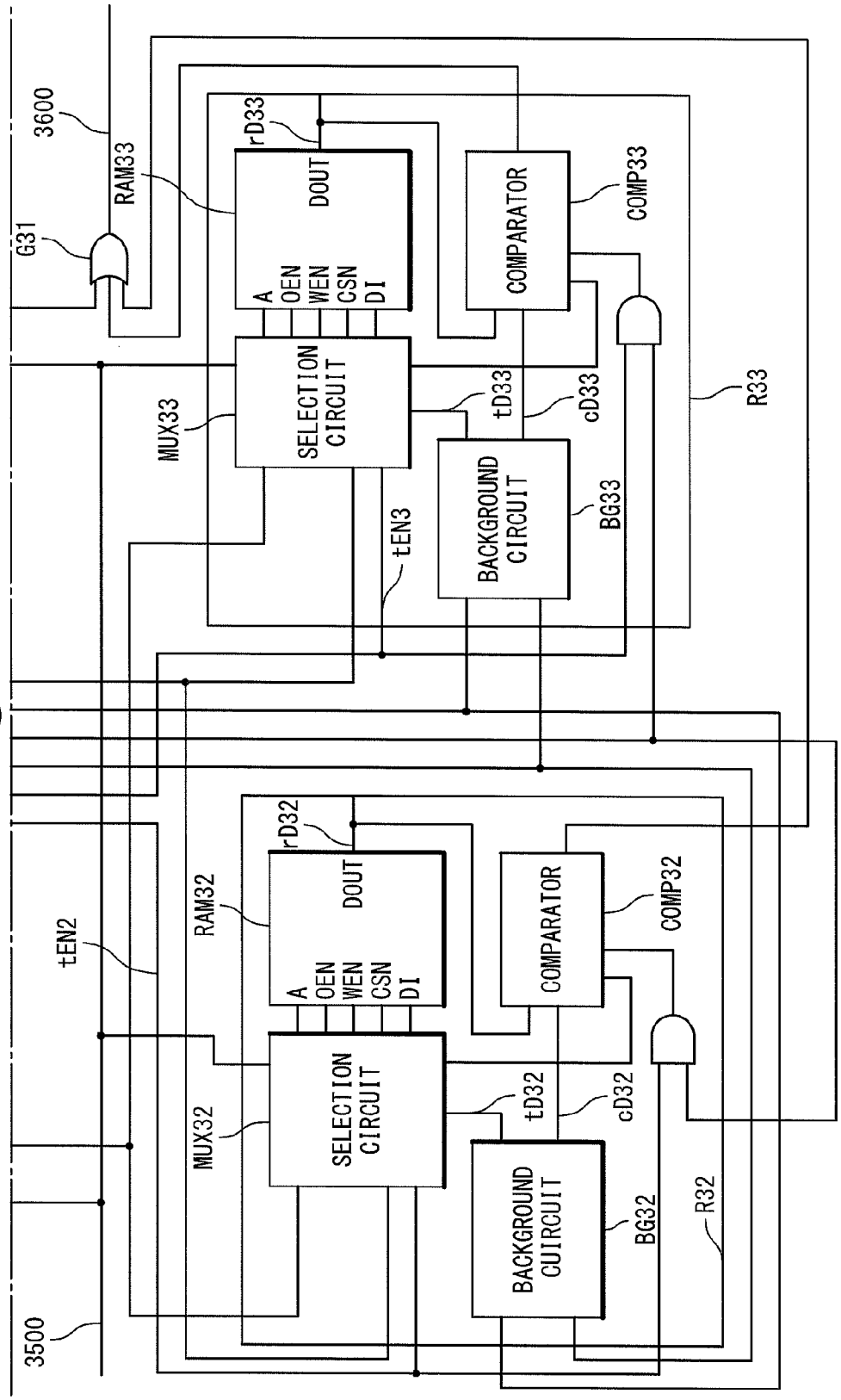
FIG. 1B is a block diagram showing the known semiconductor memory device described in JP-A-Heisei 10-187554.
Figure 2:
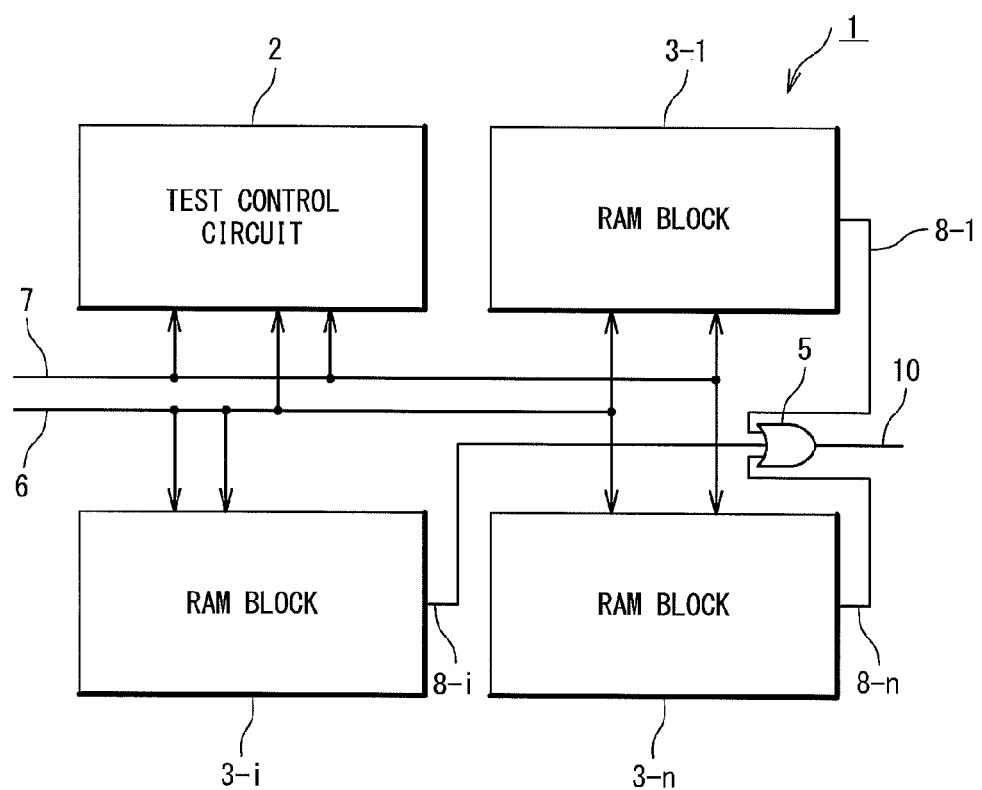
FIG. 2 is a block diagram showing a semiconductor memory device according to the present invention.

Referring to the attached drawings, a semiconductor memory device according to an embodiment of the present invention is described below. As depicted in FIG. 2, a semiconductor memory device 1 includes: a test control circuit 2; a plurality of RAM blocks 3-1 to 3-n (n=3, 4, 5, . . . ); and a combining circuit 5. The test control circuit 2 is connected to the plurality of RAM blocks 3-1 to 3-n so as to be able to transmit an electrical signal. The test control circuit 2 further includes an external device (not shown). The external device outputs a clock signal 6 and a BISTMODE signal 7. The BISTOMODE signal 7 indicates a mode of the semiconductor memory device 1, that is, either one of a normal operation time and a test operation time. When the BISTMODE signal 7 indicates that it is the test operation time, the test control circuit 2 generates a plurality of test operation control signals in synchronization with the clock signal 6.

When the BISTMODE signal 7 indicates that it is the test operation time, each RAM block 3-i (i=1, 2, 3, . . . , n) of the plurality of RAM blocks 3-1 to 3-n generates a comparison result signal 8-i in synchronization with the clock signal 6 based on the test operation control signal generated by the test control circuit 2. The combining circuit 5 generates an error signal 10 based on the plurality of comparison result signals 8-1 to 8-n generated by the plurality of RAM blocks 3-1 to 3-n. The error signal 10 indicates a logical OR of a plurality of data indicated by the plurality of comparison result signals 8-1 to 8-n.

Figure 3:
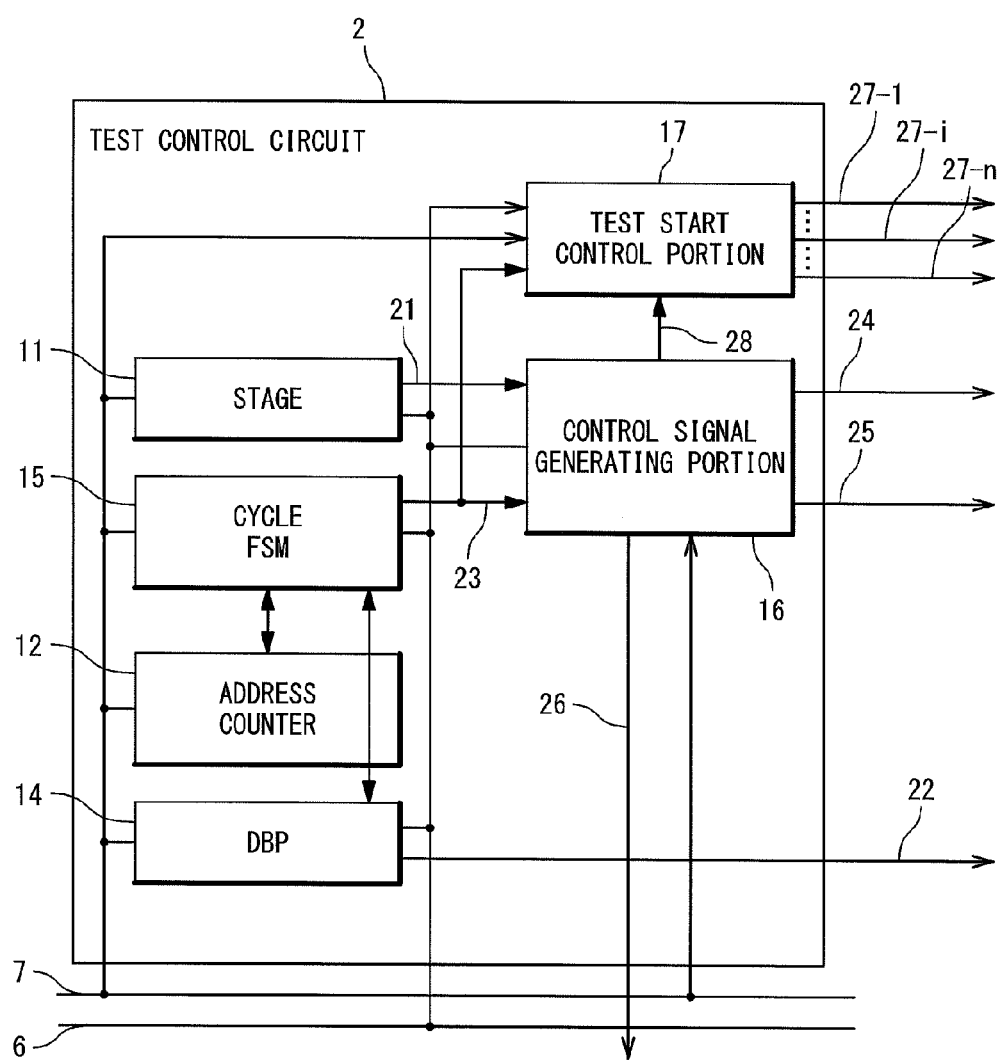
FIG. 3 is a block diagram showing a test control circuit.

FIG. 3 shows the test control circuit 2. The test control circuit 2 includes: a stage 11; an address counter 12; a data generation counter 14; a CYCLEFSM 15, a control signal generating portion 16, and a test start control portion 17, which operate in synchronization with the clock signal 6. The stage 11 is connected to the CYCLEFSM 15 so as to be able to transmit an electrical signal, and is also connected to the control signal generating portion 16 so as to be able to transmit an electrical signal. Based on exchanges of signals with the CYCLEFSM 15, the stage 11 counts test modes (initializing, writing, reading, and comparing) of the semiconductor memory device 1, and generates a control signal 21. The address counter 12 is connected to the CYCLEFSM 15 so as to be able to transmit an electrical signal. When the BIST-MODE signal 7 indicates that it is the test operation time, the address counter 12 counts test addresses based on exchanges of signals with the CYCLEFSM 15. The data generation counter 14 is connected to the CYCLEFSM 15 so as to be able to transmit an electrical signal. When the BISTMODE signal 7 indicates that it is the test operation time, the data generation counter 14 counts data generation methods for each test mode based on exchanges of signals with the CYCLEFSM 15, and generates a data generation control signal 22. The CYCLEFSM 15 is connected to the control signal generating portion 16 so as to be able to transmit an electrical signal, and is also connected to the test start control portion 17 so as to be able to transmit an electrical signal. When the BISTMODE signal 7 indicates that it is the test operation time, the CYCLEFSM 15 generates an output signal 23 indicating a test operation cycle based on exchanges of signals with the stage 11, the address counter 12, and the data generation counter 14.

When the BISTMODE signal 7 indicates that it is the test operation time, the control signal generating portion 16 generates a control signal 28, a chip control signal 24, a write control signal 25, and a control signal 26 based on the control signal 21 and the output signal 23.

The test start control portion 17 associates or correlates a plurality of RAM macros included in the plurality of RAM blocks 3-1 to 3-n with a plurality of memory test execution periods. The test start control portion 17 includes, for example, information such as the set of first-stage test-target RAMmacros to the set of fifth-stage test-target RAMmacros, which represent the order of testing the RAM macros as described later in conjunction with FIG. 11. When the BIST-MODE signal 7 indicates that it is the test operation time, the test start control portion 17 generates a plurality of start control signals 27-1 to 27-n based on the output signal 23 and the control signal 28. Each start control signal 27-i indicates a memory test execution period corresponding to a RAM macro included in the RAM block 3-i among the plurality of memory test execution periods. The RAM macro included in the RAM block 3-i is tested based on the corresponding one of the plurality of memory test execution periods, which is exemplified in FIG. 11.

Figure 4:
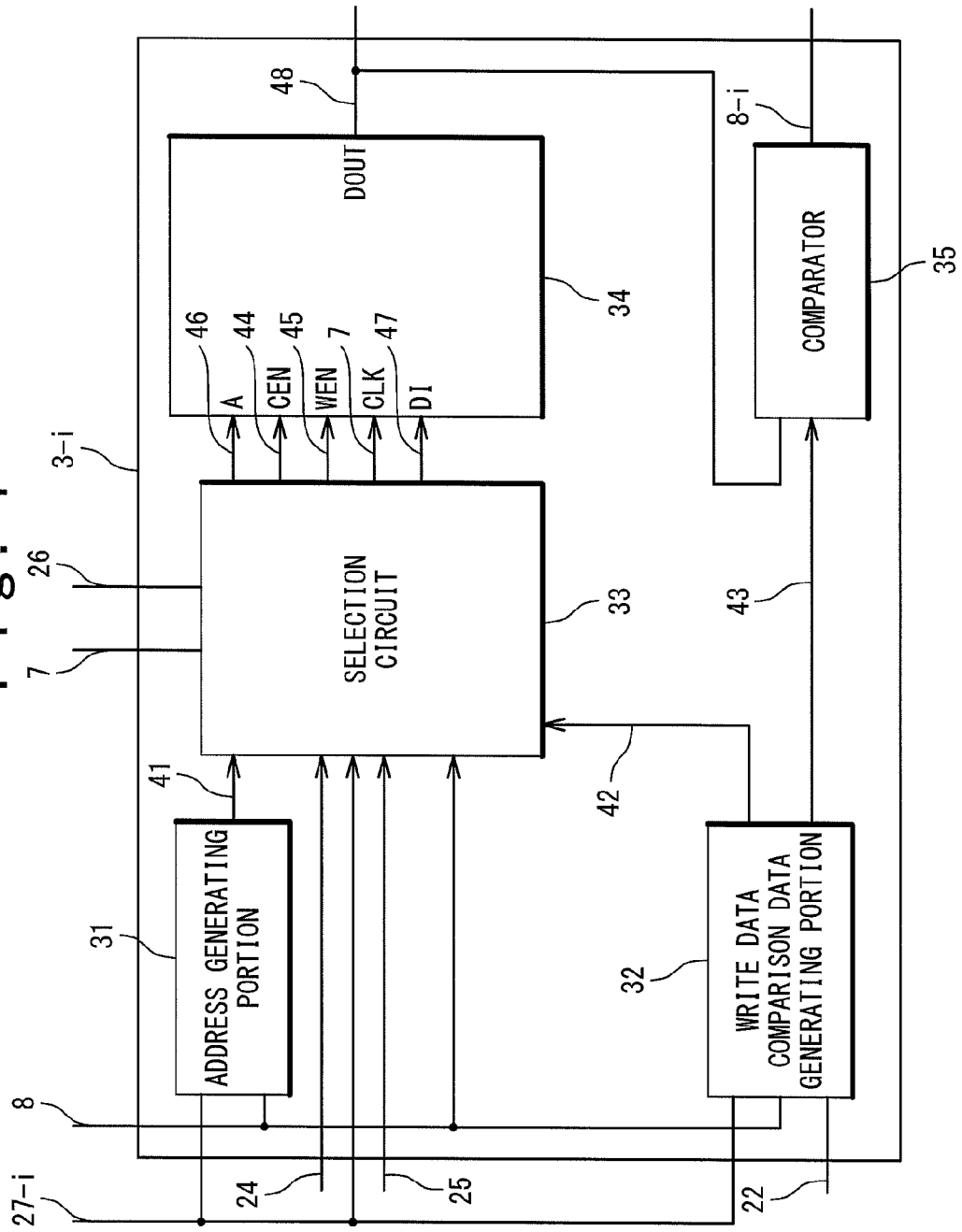
FIG. 4 is a block diagram showing a RAM block.

FIG. 4 shows the RAM block 3-i. The RAM block 3-i includes: an address generating portion 31, a write data comparison data generating portion 32, a selection circuit 33, a RAM macro 34, and a comparator 35 which operate in synchronization with the clock signal 6. The address generating portion 31 is connected to the selection circuit 33 so as to be able to transmit an electrical signal. When the BISTMODE signal 7 indicates that it is the test operation time, the address generating portion 31 generates an address signal 41 based on the start control signal 27-i. The address signal 41 is outputted when the start control signal 27-i indicates that it is the memory test execution period, and indicates one of a plurality of addresses corresponding to a plurality of storage areas included in the RAM macro 34.

The write data comparison data generating portion 32 is connected to the selection circuit 33 so as to be able to transmit an electrical signal, and is also connected to the comparator 35 so as to be able to transmit an electrical signal. The write data comparison data generating portion 32 generates a write data signal 42 and a comparison data signal 43 based on the start control signal 27-i and the data generation control signal 22. The write data signal 42 and the comparison data signal 43 are outputted when the start control signal 27-i indicates that it is the memory test execution period. Data indicated by the write data signal 42 matches data indicated by the comparison data signal 43.

The selection circuit 33 is connected to the RAM macro 34 so as to be able to transmit an electrical signal, and is further connected to a memory access circuit (not shown) so as to be able to transmit an electrical signal. The memory access circuit outputs a chip control signal, a write control signal, an address signal, and a write data signal. Based on the start control signal 27-$i$, the chip control signal 24, the write control signal 25, the control signal 26, the address signal 41, the write data signal 42, and an address signal, a chip control signal, a write control signal, and a write data signal that are outputted from the memory access circuit, the selection circuit 33 generates a chip control signal 44, a write control signal 45, and address signal 46, and a write data signal 47.

When the start control signal 27-$i$ indicates that it is the memory test execution period, the chip control signal 44 matches the chip control signal 24. When the start control signal 27-$i$ indicates that it is not the memory test execution period, the chip control signal 44 matches a chip control signal outputted from the memory access circuit. When the start control signal 27-$i$ indicates that it is the memory test execution period, the write control signal 45 matches the write control signal 25. When the start control signal 27-$i$ indicates that it is not the memory test execution period, the write control signal 45 matches the write control signal outputted from the memory access circuit. When the start control signal 27-$i$ indicates that it is the memory test execution period, the address signal 46 matches the address signal 41. When the start control signal 27-$i$ indicates that it is not the memory test execution period, the address signal 46 matches the address signal outputted from the memory access circuit. When the start control signal 27-$i$ indicates that it is the memory test execution period, the write data signal 47 matches the write data signal 42. When the start control signal 27-$i$ indicates that it is not the memory test execution period, the write data signal 47 matches the write data signal outputted from the memory access circuit.

The RAM macro 34 is connected to the comparator 35 so as to be able to transmit an electrical signal, and is further connected to the memory access circuit so as to be able to transmit an electrical signal. The RAM macro 34 includes a plurality of storage areas corresponding to the plurality of addresses. When the chip control signal 44 and the write control signal 45 indicate a write mode, the RAM macro 34 records data indicated by the write data signal 47 on a storage area corresponding to the address indicated by the address signal 46 among the plurality of storage areas. Furthermore, in a read mode, the RAM macro 34 outputs to the comparator 35 and the memory access circuit an output data signal 48 indicating data recorded on a storage area corresponding to an address indicated by the address signal 46 among the plurality of storage areas.

The comparator 35 generates a comparison result signal 8-$i$ based on the comparison data signal 43 and the output data signal 48. The comparison result signal 8-$i$ indicates whether data indicated by the comparison data signal 43 matches data indicated by the output data signal 48.

Figure 5:
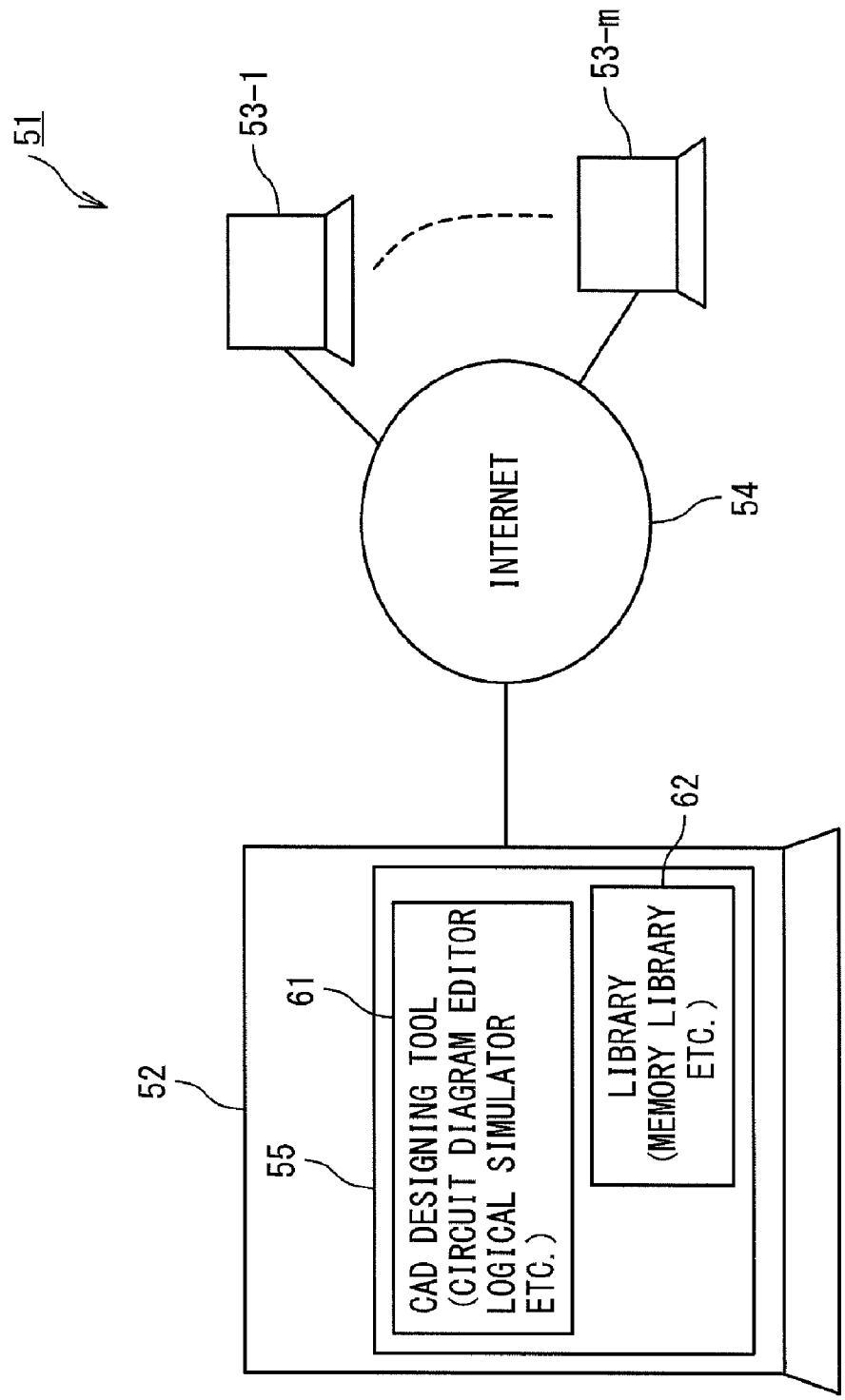
FIG. 5 is a block diagram showing a memory test method designing system.

FIG. 5 shows a memory test method designing system in which a memory test method according to the present invention is performed. A memory test method designing system 51 includes: a server 52; and a plurality of computer devices 53-1 to 53-$m$ ($m$=2, 3, 4, . . . ). The server 52 is connected to the plurality of computer devices 53-1 to 53-$m$ so as to be able to transmit information bi-directionally via the Internet 54. Each computer device 53-$j$ ($j$=1, 2, 3, . . . , m) of the plurality of computer devices 53-1 to 53-$m$ includes a computer exemplified by an engineering work station, and is provided with a local hard disk and memory, which are not shown.

The server 52 includes a storage medium 55 that a CAD designing tool 61 (for example, a circuit editor, a logical simulator and so on) and a library 62 (for example, a memory library and so on) are stored. The CAD designing tool 61 and the library 62 are downloaded to the computer device 53-$j$ via the Internet 54, and are stored in a local hard disk or memory in the computer device 53-$j$. The computer device 53-$j$ performs system development by using the CAD designing tool 61 and the library 62. The server 52 may provide such services to the computer device 53-$j$ as the ASP (Application Service Provider). The server 52 and the computer device 53-$j$ may be combined to be one computer device. The library 62 may be originally stored in the computer device 53-$j$.

FIGS. 6A to 6D show a memory test method according an embodiment of the present invention. The computer device 53-$j$ (the CAD designing tool 61) first ensures a plurality of storage areas (registers) in a storage device. The plurality of storage areas records thereon a power table, an allowable maximum power Wmax, a minimum test word length Wmin, a minimum word length RAM macro Mmin, a set of selection RAM macros, a set of first selected RAM macros, a set of second selected RAM macros, a set of test-setting-complete RAM macros, a set of test-setting-incomplete RAM macros, sets of first to n-th stages test-target RAM macros, and a set of test word lengths. The computer device 53-$j$ collects LSI design data including power data and word length data from a memory library 62, and generates a power table from that LSI design data based on the LSI design data (step S1). The power table associates a set of RAM macros with a set of powers and a set of word lengths. That is, an element of the set of RAM macros corresponds to one element of the set of powers, and also corresponds to one element of the set of word lengths. Each element of the set of RAM macros indicates the RAM macro 34 included in one RAM block of the plurality of RAM blocks 3-1 to 3-$n$. Each element of the set of powers indicates a consumption power, and an element corresponding to a RAM macro in the set of powers indicates a power consumed when the RAM macro operates. Each element in the set of word lengths indicates a word length, and an element corresponding to a RAM macro in the set of word lengths indicates a word length of the RAM macro. A test time of the RAM macro is proportional to the word length.

The computer device 53-$j$ substitutes 1 for the variable n.

The computer device 53-$j$ further extracts an allowable maximum power Wmax from the LSI design data (step S2). The allowable maximum power Wmax indicates a maximum power that can be supplied by a power-supply wiring that supplies power-supply among a plurality of wirings included in the semiconductor memory device 1. The computer device 53-$j$ sets a word length as a first priority and a power as a second priority, and sorts the plurality of RAM macros indicated by the set of RAM macros in order of decreasing the word length and the power (step S3). That is, as for two RAM macros with different word lengths, a RAM macro with a longer word length comes first in the order. As for two RAM macros with the equal word length and different powers, a RAM macro with a larger power comes first in the order.

The computer device 53-$j$ adds the RAM macro with the maximum word length among the plurality of RAM macros to the set of test-setting-complete RAM macros, the set of selected RAM macros, the set of first-stage test-target RAM macros, and the set of first selected RAM macros, and sets the power corresponding to the RAM macro of the plurality of powers as a variable Wsum1 (step S4).

The computer device **53-*j* selects a RAM macro with the longest word length from the plurality of RAM macros except the RAM macros of the set of first selected RAM macros (that is, when step S5 is performed for the first time, the computer device 53-*j* selects from the plurality of RAM macros a RAM macro with the second longest word length to the word lengths of the RAM macros of the set of test-setting-complete RAM macros), and adds the selected RAM macro to the set of first selected RAM macros. The computer device 53-*j* then calculates a variable Wsum2 based on the selected RAM macro and the power table. The variable Wsum2 indicates a value obtained by adding the variable Wsum1 to the power corresponding to the selected RAM macro (step S5**).

The computer device **53-*j* then calculates a magnitude relation between the allowable maximum power Wmax and the variable Wsum2 (step S6). When the allowable maximum power Wmax is larger than the variable Wsum2 (YES at step S6), the computer device 53-*j* adds the selected RAM macro to the set of test-setting-complete macros, the set of selected RAM macros, and the set of first-stage test-target RAM macros, and sets the value of the variable Wsum2 as the variable Wsum1 (step S7**).

When the allowable maximum power Wmax is smaller than the variable Wsum2 (NO at step S6) or after step S7 is performed, the computer device **53-*j* compares the set of RAM macros on the power table and the set of first selected RAM macros (step S8). When the set of RAM macros on the power table and the set of first selected RAM macros do not match each other (NO at step S8), the computer device 53-*j* again performs step S5 to step S7**.

When the set of RAM macros on the power table and the set of first selected RAM macros match each other (YES at step S8), the computer device **53-*j* sets the word length corresponding to all RAM macros set in the set of selected RAM macros as the set of test word length, and sets the minimum word length of the set of test word length as the minimum test word length Wmin. The computer device 53-*j* further sets a RAM macro corresponding to the minimum test word length Wmin as the minimum test word length macro Mmin (step S9). With the operation up to step S9**, RAM macros that are started to be simultaneously tested are set in the set of first-stage test-target RAM macro.

The computer device **53-*j* then deletes the RAM macros set in the minimum word length RAM macro Mmin from the set of selected RAM macros. The computer device 53-*j* further sets a sum obtained by adding all powers corresponding to the RAM macros set in the set of selected RAM macros together as the variable Wsum1. The computer device 53-*j* further sets, in the set of second selected RAM macros, all of the RAM macros that are set in the set of selected RAM macros (step S10**).

When there is a RAM macro not subjected to test setting, that is, when the set of RAM macros on the power table and the set of test-setting-complete RAM macros do not match each other (YES at step S11), the computer device **53-*j* writes, in the set of test-setting-incomplete RAM macros, RAM macros in the set of RAM macros on the power table with the set of test-setting-complete RAM macros being deleted therefrom (step S12**).

The computer device **53-*j* then selects a RAM macro with the longest word length from the RAM macros that are set in the set of test-setting-incomplete RAM macros, and calculates the variable Wsum2 based on the selected RAM macro, the power table, and the variable Wsum1. The variable Wsum2 indicates a value obtained by adding the variable Wsum1 to the power corresponding to the selected RAM macro (step S13**).

The computer device **53-*j* then calculates a magnitude relation between the allowable maximum power Wmax and the variable Wsum2 (step S14). When the allowable maximum power Wmax is larger than the variable Wsum2 (YES at step S14), the computer device 53-*j* adds the selected RAM macro to the set of test-setting-complete RAM macros and the set of selected RAM macros, and sets the value of the variable Wsum2 as the variable Wsum1 (step S15**).

When the allowable maximum power Wmax is equal to or smaller than the variable Wsum2 (NO at step S14) or after step S15 is performed, the computer device **53-*j* deletes the selected RAM macro from the set of test-setting-incomplete RAM macros, and determines whether the RAM macro remains in the test-setting-incomplete RAM macro set (step S16). When the RAM macro remains in the set of test-setting-incomplete RAM macros (NO at step S16), the computer device 53-*j* again performs step S13 to step S15**.

When the RAM macro does not remain in the set of test-setting-incomplete RAM macros (YES at step S16), the computer device **53-*j* updates the variable n to a value obtained by adding 1 to the variable n. The computer device 53-*j* further sets the RAM macros of the set of selected RAM macros in the set of n-th stage test-target RAM macros. The computer device 53-*j* further compares the set of selected RAM macros and the set of second selected RAM macros to determine whether there is any RAM macro added at step S15 to the set of selected RAM macros (step S17**).

When there is no RAM macro added to the set of selected RAM macros (NO at step S17), the computer device **53-*j* sets the second shortest test word length to the minimum test word length Wmin among the word lengths corresponding to the RAM macros in the set of selected RAM macros as the minimum test word length Wmin (step S18), and then again performs step S10** onward.

When there is any RAM macro added to the set of selected RAM macros (YES at step S17), the computer device **53-*j* sets the added RAM macro as a RAM macro to be tested next to the RAM macro with the minimum test word length Wmin. The computer device 53-*j* further sets a value obtained by adding the minimum test word length Wmin to the word length of the added RAM macro as the minimum test word length Wmin (step S19**).

Next, the computer device **53-*j* sorts the word lengths in the set of test word lengths in increasing order, sets the second shortest test word length to the minimum test word length Wmin as the minimum test word length Wmin (step S20), and then again performs step S10** onward.

When the set of RAM macros and the set of test-setting-complete RAM macros on the power table match each other (NO at step S11), the computer device **53-*j*** ends test order setting for the RAM macros.

According to the operation in FIGS. 6A to 6D, the order of testing the RAM macros is set in each of the sets of the first to n-th stages test-target RAM macros. Based on the order, the computer device **53-*j* further calculates a plurality of memory test execution periods. The plurality of memory test execution periods correspond to a plurality of RAM macros 34 included in the plurality of RAM blocks 3-1 to 3-*n*. A memory test execution period corresponding to a RAM macro included in the plurality of memory test execution periods is calculated so as to be proportional to the word length of that RAM macro. Each start time of the plurality of memory test execution periods is calculated so that, after a section in which only the RAM macros belonging to a set of i-th stage test-target RAM macros are tested, a section in which only the RAM macros belonging to an set of (i+1)-th stage test-target RAM macros are tested comes. In the semiconductor memory device 1**, the test start control portion 17 is designed and fabricated so that the plurality of calculated memory test execution periods correspond to the plurality of RAM macros 34.

EXAMPLE OF THE EMBODIMENT

A semiconductor memory device according to an example of the present invention includes seven RAM blocks 3-1 to 3-7.
The RAM block 3-1 includes a RAM macro 34 (hereinafter referred to as "RAM macro RAM1") associated with a word length of 256 words and a power of 125 mW. The RAM block 3-2 includes a RAM macro 34 (hereinafter referred to as "RAM macro RAM2") associated with a word length of 512 words and a power of 125 mW. The RAM block 3-3 includes a RAM macro 34 (hereinafter referred to as "RAM macro RAM3") associated with a word length of 512 words and a power of 250 mW. The RAM block 3-4 includes a RAM macro 34 (hereinafter referred to as "RAM macro RAM4") associated with a word length of 1024 words and a power of 250 mW. The RAM block 3-5 includes a RAM macro 34 (hereinafter referred to as "RAM macro RAMS") associated with a word length of 1024 words and a power of 500 mW. The RAM block 3-6 includes a RAM macro 34 (hereinafter referred to as "RAM macro RAM6") associated with a word length of 2048 words and a power of 250 mW. The RAM block 3-7 has a RAM macro 34 (hereinafter referred to as "RAM macro RAM7") associated with a word length of 1536 words and a power of 188 mW. Furthermore, the semiconductor memory device of the example is designed so that a maximum allowable power Wmax that can be supplied by a power-supply wiring is 1.1 W.

Figure 6A:
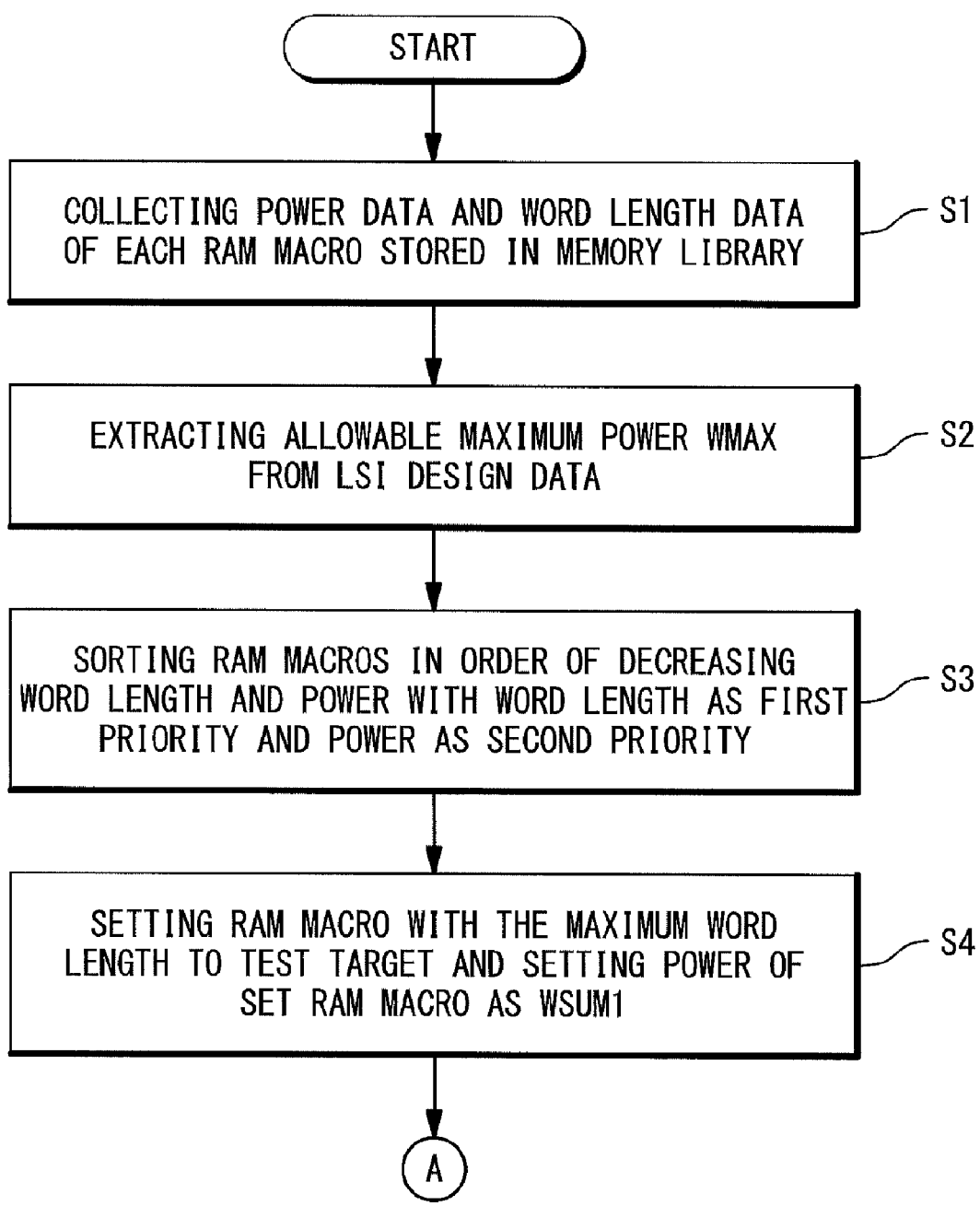
FIG. 6A is a flowchart showing a part of a memory test method according to the present invention.
Figure 6C:
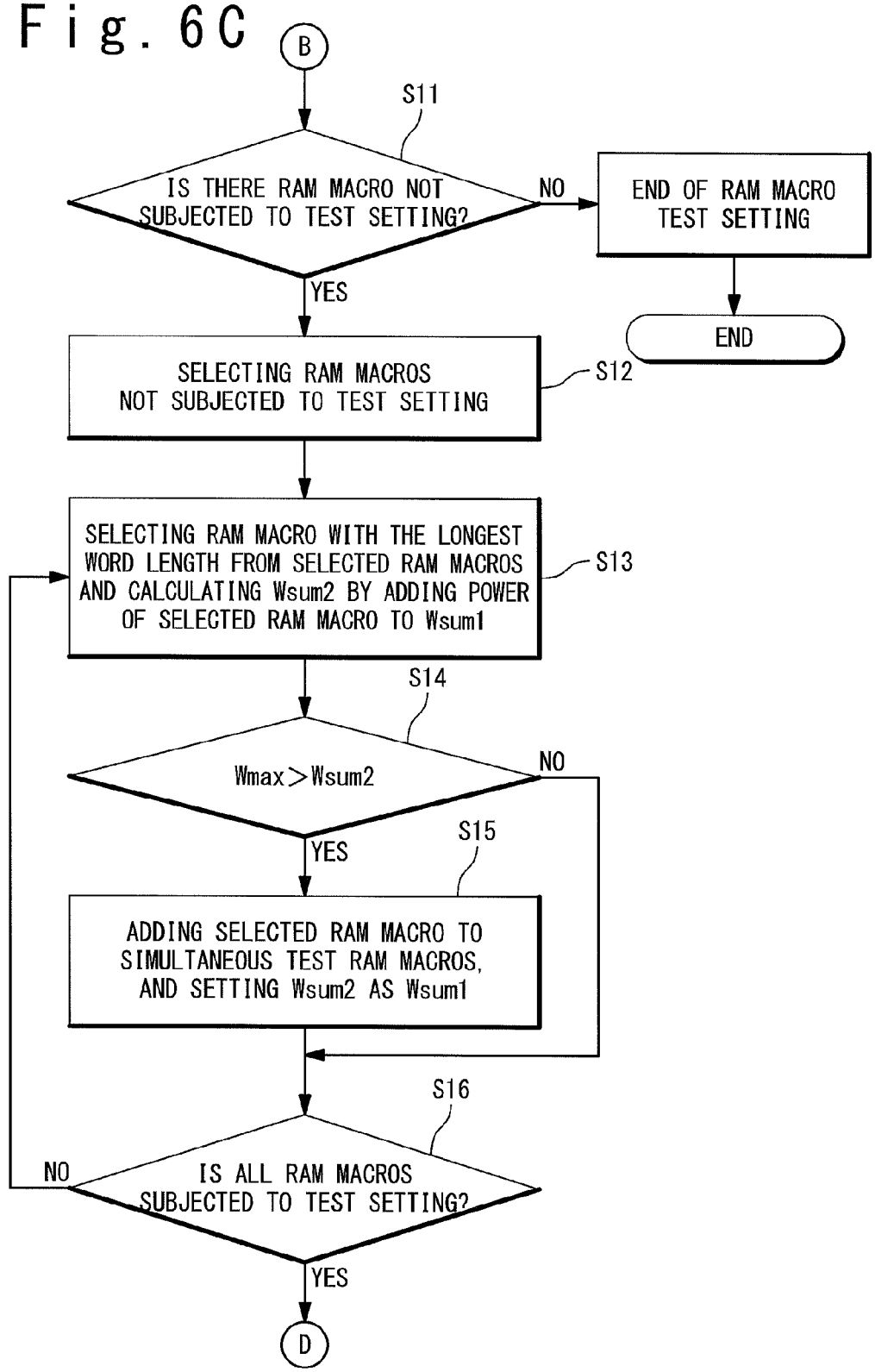
FIG. 6C is a flowchart showing a part of the memory test method according to the present invention.
Figure 6D:
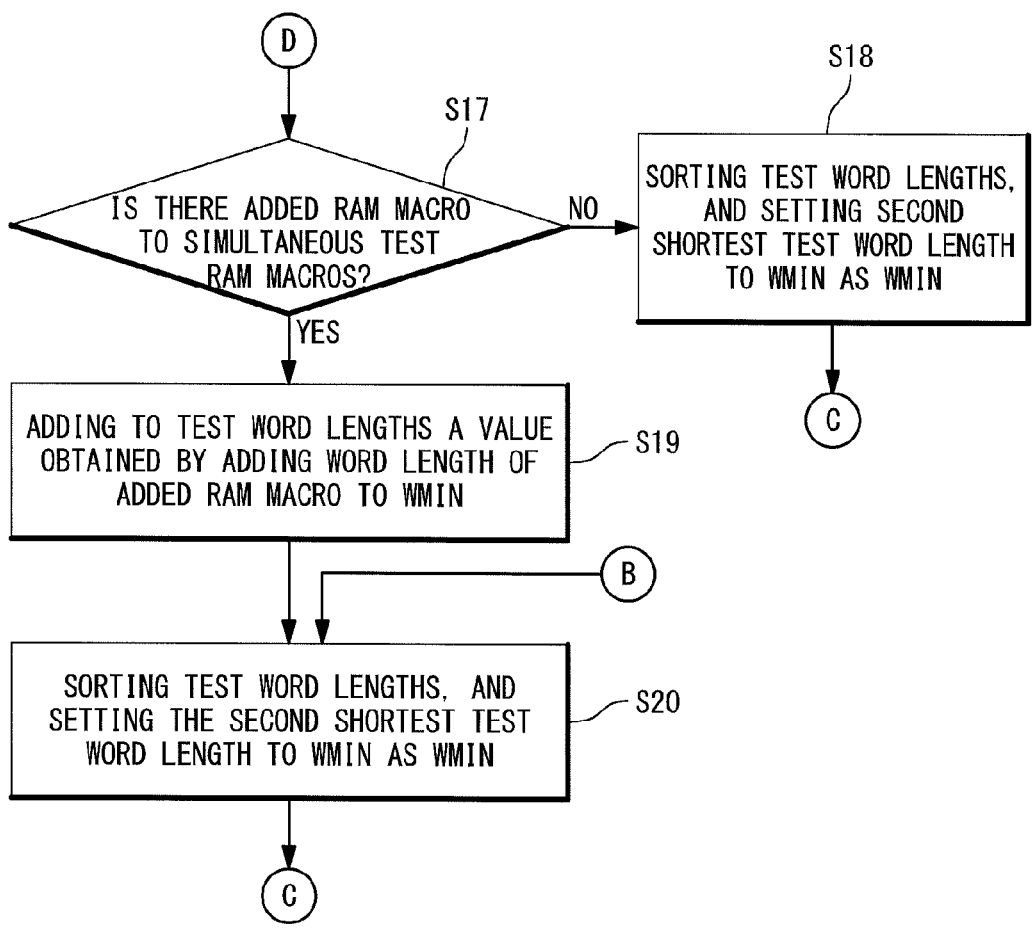
FIG. 6D is a flowchart showing a part of the memory test method according to the present invention.

Here, in sorting at step S3 of FIG. 6A, the plurality of RAM macros are arranged in order of the RAM macro RAM6, the RAM macro RAM7, the RAM macro RAMS, the RAM macro RAM4, the RAM macro RAM3, the RAM macro RAM2, and then the RAM macro RAM1. At step S4, the RAM macro RAM6 is added to the set of test-setting-complete RAM macros, the set of selected RAM macros, the set of first-stage test-target RAM macros, and the set of first selected RAM macros, and 250 mW as the power of the RAM macro RAM6 is set as the variable Wsum1.

At step S5, as a result of sorting, 438 mW obtained by adding to the variable Wsum1 the power of the RAM macro RAM7 with the second longest word length to that of the RAM macro RAM6 is set as the variable Wsum2. The selected RAM macro RAM7 is added and set to the set of first selected RAM macros.

At step S6, since the allowable maximum power Wmax is larger than the variable Wsum2, the procedure goes to step S7. 438 mW is set as the variable Wsum1.

At step S7, the RAM macro RAM7 is added to the set of test-setting-complete RAM macros, the set of selected RAM macros, and the set of first-stage test-target RAM macros.

At step S8, since there is a difference between the set of RAM macros on the power table and the set of first selected RAM macros in existence of the RAM macro RAMS, the RAM macro RAM4, the RAM macro RAM3, the RAM macro RAM2, and the RAM macro RAM1, the procedure goes to step S5.

At step S5, 938 mW obtained by adding to the variable Wsum1 the power of the RAM macro RAMS with the next longest word length to that of the RAM macro RAM7 is set as the variable Wsum2. Further, the selected RAM macro RAMS is added and set to the set of first selected RAM macros.

At step S6, since the allowable maximum power Wmax is larger than the variable Wsum2, the procedure goes to step S7. 938 mW is set as the variable Wsum1.

Further at step S7, the RAM macro RAMS is added to the set of test-setting-complete RAM macros, the set of selected RAM macros, and the set of first-stage test-target RAM macros.

At step S8, since there is a difference between the set of RAM macros on the power table and the set of first selected RAM macros in existence of the RAM macro RAM4, the RAM macro RAM3, the RAM macro RAM2, and the RAM macro RAM1, the procedure goes to step S5.

At step S5, 1188 mW obtained by adding to the variable Wsum1 the power of the RAM macro RAM4 with the next longest word length to that of the RAM macro RAMS is set as the variable Wsum2. Further, the selected RAM macro RAM4 is added and set to the set of first selected RAM macros.

At step S6, as a result of comparing the allowable maximum power Wmax and the variable Wsum2, the allowable maximum power Wmax is smaller than the variable Wsum2, and therefore the procedure goes to step S8.

At step S8, as a result of comparing the set of RAM macros on the power table and the set of first selected RAM macros, there is a difference in existence of the RAM macro RAM3, the RAM macro RAM2, and the RAM macro RAM1, and therefore the procedure goes to step S5.

At step S5, 1188 mW obtained by adding to the variable Wsum1 the power of the RAM macro RAM3 with the next longest word length to that of the RAM macro RAM4 is set as the variable Wsum2. Further, the selected RAM macro RAM3 is added and set to the set of first selected RAM macros.

At step S6, as a result of comparing the allowable maximum power Wmax and the variable Wsum2, the allowable maximum power Wmax is equal to or smaller than the variable Wsum2, and therefore the procedure goes to step S8.

At step S8, as a result of comparing the set of RAM macros on the power table and the set of first selected RAM macros, there is a difference in existence of the RAM macro RAM2 and the RAM macro RAM1, and therefore the procedure goes to step S5.

At step S5, 1063 mW obtained by adding to the variable Wsum1 the power of the RAM macro RAM2 with the next longest word length to that of the RAM macro RAM3 is set as the variable Wsum2. Further, the selected RAM macro RAM2 is added and set to the set of first selected RAM macros.

At step S6, since the allowable maximum power Wmax is larger than the variable Wsum2, the procedure goes to step S7.

At step S7, 1063 mW is set as the variable Wsum1. Further, the RAM macro RAM2 is added to the set of test-setting-complete RAM macros, the set of selected RAM macros, and the set of first-stage test-target RAM macros.

At step S8, as a result of comparing the set of RAM macros on the power table and the set of first selected RAM macros, there is a difference in existence of the RAM macro RAM1, and therefore the procedure goes to step S5.

At step S5, 1188 mW obtained by adding to the variable Wsum1 the power of the RAM macro RAM1 with the next longest word length to that of the RAM macro RAM2 is set as the variable Wsum2. Further, the selected RAM macro RAM1 is added and set to the set of first selected RAM macros.

At step S6, since the allowable maximum power Wmax is smaller than the variable Wsum2, the procedure goes to step S8.

At step S8, as a result of comparing the set of RAM macros on the power table and the set of first selected RAM macros, there is no difference, and therefore the procedure goes to step S9.

At step S9, the word lengths of 2046, 1536, 1024, and 512 of the RAM macro RAM6, the RAM macro RAM7, the RAM macro RAMS, and the RAM macro RAM2 set in the set of selected RAM macros are set in the set of test word lengths, 512 is set in the minimum test word length Wmin, and the RAM macro RAM2 is set as the minimum word length RAM macro Mmin.

With the operation so far, the RAM macro RAM6, the RAM macro RAM7, the RAM macro RAMS, and the RAM macro RAM2 are set in the set of first-stage test-target RAM macros and the set of selected RAM macros. These plurality of these RAM macros is RAM macros that are started to be simultaneously tested at the time of starting a test.

Figure 7:
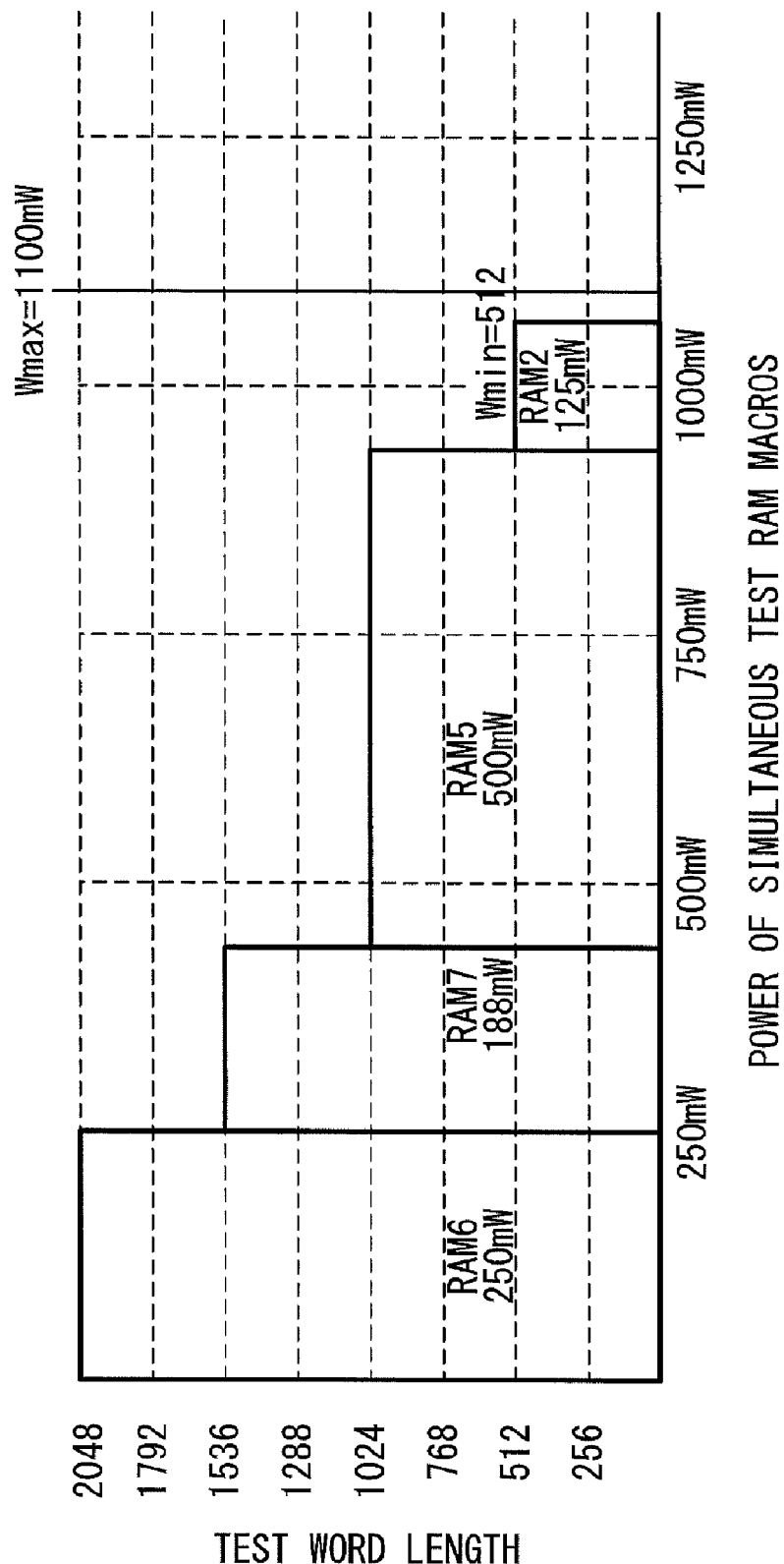
FIG. 7 is a graph showing power at the time of a memory simultaneous test.

FIG. 7 shows the word length and the power of each of the plurality of RAM macros belonging to the set of first-stage test-target RAM macros. In the graph of FIG. 7, a RAM macro is represented as a rectangle, and the length of a horizontal side of the rectangle represents the power of that RAM macro and the length of a vertical side of the rectangle represents the word length of that RAM macro. The rectangles are arranged on a xy plane so that each horizontal side is parallel to the x axis, each vertical side is parallel to the y axis, and the plurality of these rectangles do not overlap each other.

The plurality of these rectangles corresponding to the plurality of RAM macros is arranged so that each lower horizontal side overlaps the x axis. The graph of FIG. 7 shows that the y coordinate (512), which is the minimum value among y coordinates of a plurality of positions where upper horizontal sides of the plurality of rectangles is arranged, is the minimum test word length Wmin. The graph of FIG. 7 also shows that a set of y coordinates of a plurality of positions where a plurality of sides arranged in an area represented by the following equation:

$$y \geq Wmin$$

among the upper horizontal sides of the plurality of rectangles are arranged is a set of test word lengths. The graph of FIG. 7 further shows that the RAM macro RAM2 corresponding to the rectangle with the y coordinate of an upper horizontal side indicating the minimum test word length Wmin is the minimum word length RAM macro Mmin.

Next at step S10, the RAM macro RAM2 set as the minimum word length RAM macro Mmin is deleted from the RAM macro RAM6, the RAM macro RAM7, the RAM macro RAM5, and the RAM macro RAM2 set in the set of selected RAM macros. Then, 938 mW obtained by adding the powers of the RAM macro RAM5, the RAM macro RAM6, and the RAM macro RAM7 set in the set of selected RAM macros together is set as the variable Wsum1.

The set of selected RAM macros is written in the set of second selected RAM macros.

At step S11, as a result of comparing the set of RAM macros on the power table and the set of test-setting-complete RAM macros, there is a difference in existence of the RAM macro RAM4, the RAM macro RAM3, and the RAM macro RAM1, and therefore the procedure goes to step S13.

At step S12, the RAM macro RAM6, the RAM macro RAM7, the RAM macro RAM5, and the RAM macro RAM2 set in the set of test-setting-complete RAM macros are deleted from the RAM macro RAM1, the RAM macro RAM2, the RAM macro RAM3, the RAM macro RAM4, the RAM macro RAM5, the RAM macro RAM6, and the RAM macro RAM7 set in the power table. The obtained RAM macro RAM4, the RAM macro RAM3, and the RAM macro RAM1 are written in the set of test-setting-incomplete RAM macros.

At step S13, the RAM macro RAM4 with a large word length is selected from the RAM macro RAM4, the RAM macro RAM3, and the RAM macro RAM1 set in the set of test-setting-incomplete RAM macros, and 1188 mW obtained by adding the power of the RAM macro RAM4 to the variable Wsum1 is set as the variable Wsum2.

At step S14, since the allowable maximum power Wmax is smaller than the variable Wsum2, the procedure goes to step S16.

At step S16, the RAM macro RAM4 selected at step S13 is deleted from the set of test-setting-incomplete RAM macros. Since the RAM macro RAM3 and the RAM macro RAM1 remain in the set of test-setting-incomplete RAM macros, the procedure goes to step S13.

At step S13, the RAM macro RAM3 with a large word length is selected from the RAM macro RAM3 and the RAM macro RAM1 set in the set of test-setting-incomplete RAM macros, and 1188 mW obtained by adding the power of the RAM macro RAM3 to the variable Wsum1 is set as the variable Wsum2.

At step S14, since the allowable maximum power Wmax is smaller than the variable Wsum2, the procedure goes to step S16.

At step S16, the RAM macro RAM3 selected at step S13 is deleted from the set of test-setting-incomplete RAM macros. Since the RAM macro RAM1 remains in the test-setting-incomplete RAM macro set, the procedure goes to step S13.

At step S13, the RAM macro RAM1 with a large word length is selected from the RAM macro RAM1 set in the test-setting-incomplete RAM macro set, and 1063 mW obtained by adding the power of the RAM macro RAM1 to the variable Wsum1 is set as the variable Wsum2.

At step S14, since the allowable maximum power Wmax is larger than the variable Wsum2, the procedure goes to step S15.

At step S15, 1063 mW is set as the variable Wsum1. The RAM macro RAM1 is added to the set of test-setting-complete RAM macros and the set of selected RAM macros. Here, the set of selected RAM macros includes the RAM macro RAM6, the RAM macro RAM7, the RAM macro RAM5, and the RAM macro RAM1.

At step S16, the RAM macro RAM1 selected at step S13 is deleted from the set of test-setting-incomplete RAM macros. Since no RAM macro remains in the set of test-setting-incomplete RAM macros, the procedure goes to step S17.

At step S17, 2 is set as a variable n, and the set of selected RAM macros is written in the set of second-stage test-target RAM macros. As a result of comparing the set of selected RAM macros and the set of first selected RAM macros, the RAM macro RAM1 added at step S15 to the set of selected RAM macros is selected, and then the procedure goes to step S19.

At step S19, the RAM macro RAM1 selected at step S17 (as a test target following the minimum test word length Wmin (=512:RAM2)) is added to the set of test-setting-complete RAM macros and the set of selected RAM macros. Also, a word length of 768 obtained by adding a word length of 256 of the RAM macro RAM1 to a word length of 512 of the minimum test word length Wmin is added to the set of test word lengths.

At step S20, test word lengths of 2048, 1536, 1024, 768, and 512 are sorted in increasing order. The test word length of 768, which is the next shortest test word length to the minimum test word length Wmin (=512:RAM2), is set as the minimum test word length Wmin. The RAM macro RAM1 corresponding to the minimum test word length Wmin is set as the minimum word length RAM macro Mmin.

With the operation so far, the RAM macro RAM6, the RAM macro RAM7, the RAM macro RAM5, and the RAM macro RAM1 to be simultaneously tested at the second stage are set in the set of second-stage test-target RAM macros.

Figure 8:
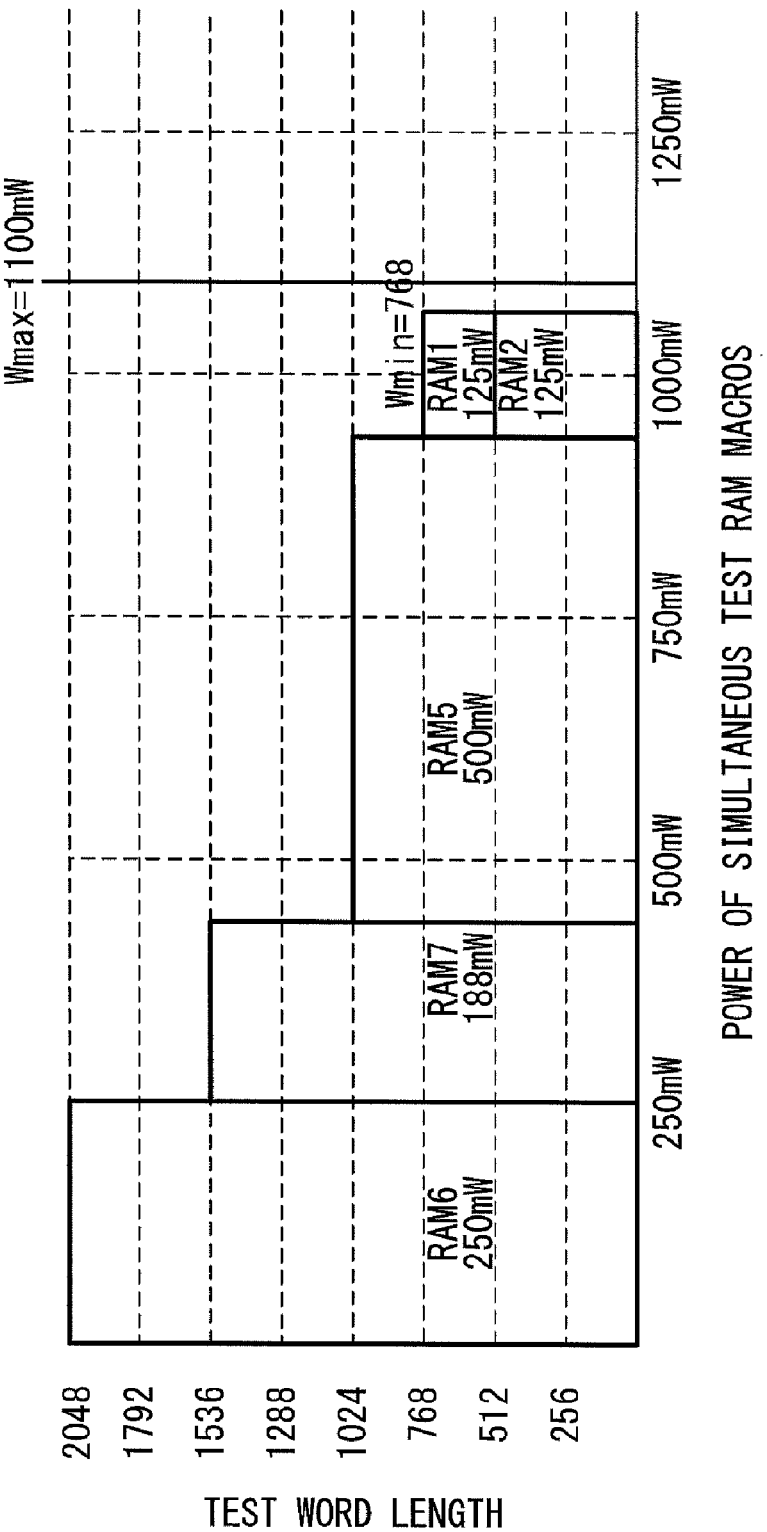
FIG. 8 is a graph showing power at the time of a memory simultaneous test.

FIG. 8 shows the word length and the power of each of the plurality of RAM macros belonging to the set of second-stage test-target RAM macros. The plurality of rectangles is arranged in an area represented by the following equation:

$$y \geq Wmin'.$$

Here, the minimum test word length Wmin' represents the minimum test word length Wmin when the set of first-stage test-target RAM macros is set.

The graph of FIG. 8 shows that the y coordinate (768), which is the minimum value among y coordinates of a plurality of positions where upper horizontal sides of the plurality of rectangles are arranged, is the minimum test word length Wmin.

The graph of FIG. 8 shows that a set of y coordinates of a plurality of positions where a plurality of sides arranged in an area represented by the following equation:

$$y \geq Wmin$$

among the upper horizontal sides of the plurality of rectangles are arranged is a set of test word lengths.

The graph of FIG. 8 shows that the RAM macro RAM1 corresponding to the rectangle with the y coordinate of an upper horizontal side indicating the minimum test word length Wmin is the minimum word length RAM macro Mmin.

Next at step S10, the RAM macro RAM1 set as the minimum word length RAM macro Mmin is deleted from the RAM macro RAM6, the RAM macro RAM7, the RAM macro RAM5, and the RAM macro RAM1 set in the set of selected RAM macros. Then, 938 mW obtained by adding the powers of the RAM macro RAM5, the RAM macro RAM6, and the RAM macro RAM7 in the set of selected RAM macros together is set as the variable Wsum1. Further, the set of selected RAM macros is written in the set of second selected RAM macros.

Next at step S11, as a result of comparing the set of RAM macros on the power table and the set of test-setting-complete RAM macros, there is a difference in existence of the RAM macro RAM4 and the RAM macro RAM3, and therefore the procedure goes to step S12.

At step S12, the RAM macro RAM6, the RAM macro RAM7, the RAM macro RAM5, the RAM macro RAM2, and the RAM macro RAM1 set in the set of test-setting-complete RAM macros are deleted from the RAM macro RAM1, the RAM macro RAM2, the RAM macro RAM3, the RAM macro RAM4, the RAM macro RAM5, the RAM macro RAM6, and the RAM macro RAM7 set on the power table. The obtained RAM macro RAM4 and the RAM macro RAM3 are written in the set of test-setting-incomplete RAM macros.

At step S13, the RAM macro RAM4 with a large word length is selected from the RAM macro RAM4 and the RAM macro RAM3 set in the set of test-setting-incomplete RAM macros, and 1188 mW obtained by adding the power of the RAM macro RAM4 to the variable Wsum1 is set as the variable Wsum2.

Next at step S14, since the allowable maximum power Wmax is smaller than the variable Wsum2, the procedure goes to step S16.

At step S16, the RAM macro RAM4 selected at step S13 is deleted from the set of test-setting-incomplete RAM macros. Since the RAM macro RAM3 remains in the set of test-setting-incomplete RAM macros, the procedure goes to step S13.

At step S13, the RAM macro RAM3 with a large word length is selected from the RAM macro RAM3 set in the set of test-setting-incomplete RAM macros, and 1188 mW obtained by adding the power of the RAM macro RAM3 to the variable Wsum1 is set as the variable Wsum2.

Next at step S14, since the allowable maximum power Wmax is smaller than the variable Wsum2, the procedure goes to step S16.

At step S16, the RAM macro RAM3 selected at step S13 is deleted from the set of test-setting-incomplete RAM macros. Since no RAM macro remains in the set of test-setting-incomplete RAM macros, the procedure goes to step S17.

At step S17, 2+1 is written in the variable n, and the set of selected RAM macros is written in the set of third-stage test-target RAM macros. As a result of comparing the set of selected RAM macros and the set of second selected RAM macros, a RAM macro added at step S15 to the set of selected RAM macros is not present, and therefore the procedure goes to step S18.

At step S18, 1024, which is the second smallest to 768 set as the minimum test word length Wmin among the test word lengths of 2048, 1536, 1024, and 768, is set as the minimum test word length Wmin, and the RAM macro RAM5 corresponding to the minimum test word length Wmin is set as the minimum word length RAM macro Mmin.

With the operation so far, the RAM macro RAM6, the RAM macro RAM7, and the RAM macro RAM5 to be simultaneously tested at the third stage are set in the set of third-stage test-target RAM macros.

Figure 9:
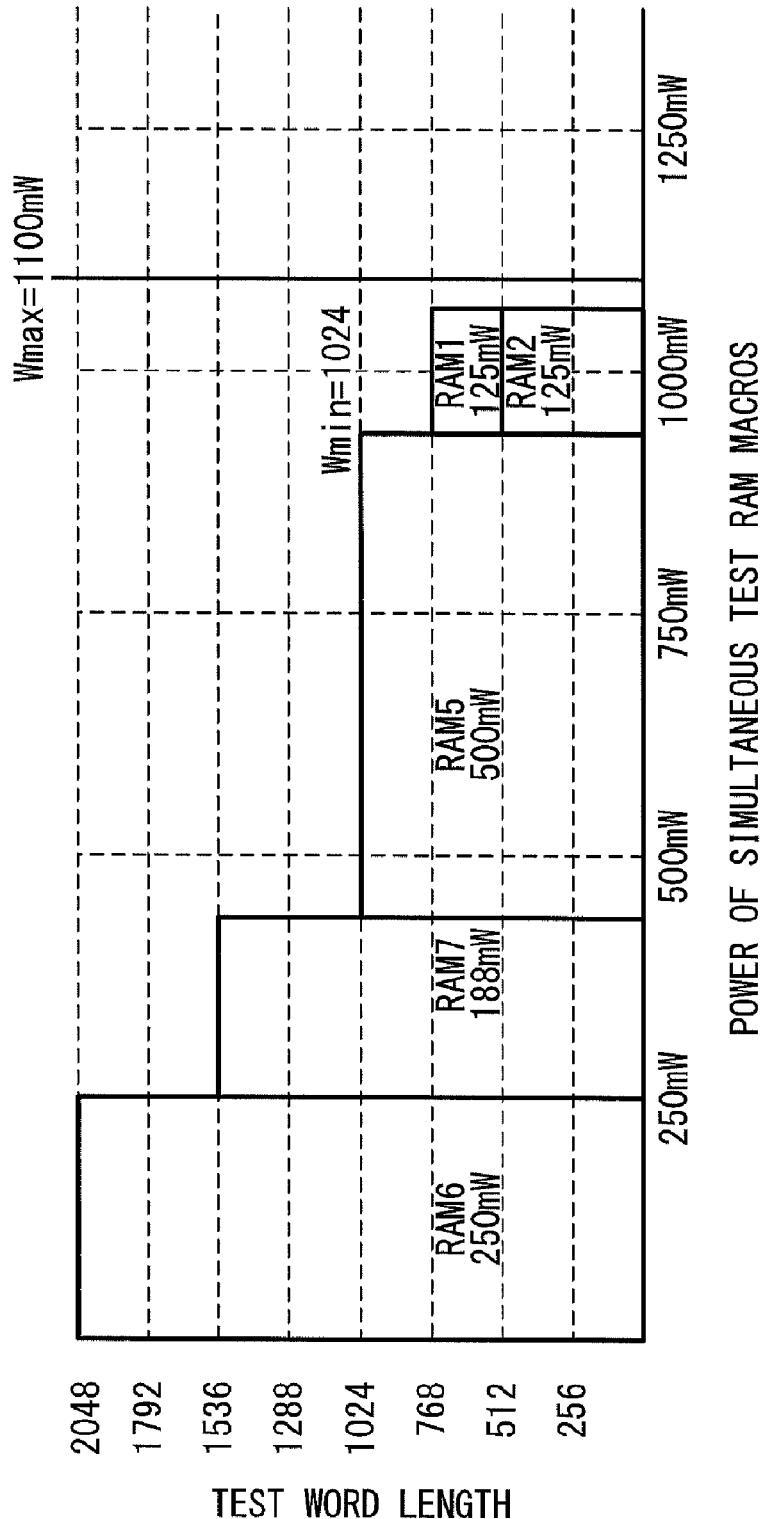
FIG. 9 is a graph showing power at the time of a memory simultaneous test.

FIG. 9 shows the word length and the power of each of the plurality of RAM macros belonging to the set of third-stage test-target RAM macros. The plurality of rectangles is arranged in an area represented by the following equation:

$$y \geq Wmin'.$$

Here, the minimum test word length Wmin' represents the minimum test word length Wmin when the set of second-stage test-target RAM macros is set.

The graph of FIG. 9 shows that the y coordinate (1024), which is minimum value among y coordinates of a plurality of positions where upper horizontal sides of the plurality of rectangles are arranged, is the minimum test word length Wmin.

The graph of FIG. 9 shows that a set of y coordinates of a plurality of positions where a plurality of sides arranged in an area represented by the following equation:

$$y \geq Wmin$$

among the upper horizontal sides of the plurality of rectangles are arranged is a set of test word lengths.

The graph of FIG. 9 shows that the RAM macro RAM5 corresponding to the rectangle with the y coordinate of an upper horizontal side indicating the minimum test word length Wmin is the minimum word length RAM macro Mmin.

Next at step S10, the RAM macro RAM5 set as the minimum word length RAM macro Mmin is deleted from the RAM macro RAM6, the RAM macro RAM7, and the RAM macro RAM5 set in the set of selected RAM macros. Then, 438 mW obtained by adding the powers of the RAM macro RAM6 and the RAM macro RAM7 in the set of selected RAM macros together is set as the variable Wsum1. Further, the set of selected RAM macros is written in the set of second selected RAM macros.

Next at step S11, as a result of comparing the set of RAM macros on the power table and the set of test-setting-complete RAM macros, there is a difference in existence of the RAM macro RAM4 and the RAM macro RAM3, and therefore the procedure goes to step S12.

At step S12, the RAM macro RAM4 and the RAM macro RAM3 obtained by deleting the RAM macro RAM6, the RAM macro RAM7, the RAM macro RAM5, the RAM macro RAM2, and the RAM macro RAM1 set in the set of test-setting-complete RAM macros from the RAM macro RAM1, the RAM macro RAM2, the RAM macro RAM3, the RAM macro RAM4, the RAM macro RAM5, the RAM macro RAM6, and the RAM macro RAM7 set on the power table are written in the set of test-setting-incomplete RAM macros.

At step S13, the RAM macro RAM4 with a large word length is selected from the RAM macro RAM4 and the RAM macro RAM3 set in the set of test-setting-incomplete RAM macros, and 688 mW obtained by adding the power of the RAM macro RAM4 to the variable Wsum1 is set as the variable Wsum2.

At step S14, since the allowable maximum power Wmax is larger than the variable Wsum2, the procedure goes to step S15.

At step S15, 688 mW is set as the variable Wsum1. Further, the RAM macro RAM4 is added to the set of test-setting-complete RAM macros and the set of selected RAM macros.

At step S16, the RAM macro RAM4 selected at step S13 is deleted from the set of test-setting-incomplete RAM macros. Since the RAM macro RAM3 remains in the set of test-setting-incomplete RAM macros, the procedure goes to step S13.

At step S13, the RAM macro RAM3 with a large word length is selected from the RAM macro RAM3 set in the set of test-setting-incomplete RAM macros, and 938 mW obtained by adding the power of the RAM macro RAM3 to the variable Wsum1 is set as the variable Wsum2.

Next at step S14, since the allowable maximum power Wmax is larger than the variable Wsum2, the procedure goes to step S15.

At step S15, 938 mW is set as the variable Wsum1. Further, the RAM macro RAM3 is added to the set of test-setting-complete RAM macros and the set of selected RAM macros.

At step S16, the RAM macro RAM3 selected at step S13 is deleted from the set of test-setting-incomplete RAM macros. Since there is no RAM remaining in the set of test-setting-incomplete RAM macros, the procedure goes to step S17.

At step S17, 3+1 is written in the variable n, and the set of selected RAM macros is written in the set of fourth-stage test-target RAM macros. Also, as a result of comparing the set of selected RAM macros and the set of second selected RAM macros, the RAM macro RAM4 and the RAM macro RAM3 added at step S15 to the set of selected RAM macros are selected, and then the procedure goes to step S19.

At step S19, the RAM macro RAM4 and the RAM macro RAM3 selected at step S17 (as a test target following the minimum test word length Wmin (=1024:RAM5)) are added to the set of test-setting-complete RAM macros and the set of selected RAM macros. Also, a word length of 2048 obtained by adding the word length of 1024 of the RAM macro RAM4 to the word length of 1024 of the minimum test word length Wmin is added to the set of test word lengths, and a word length of 1536 obtained by adding the word length of 512 of the RAM macro RAM3 to the word length of 1024 of the minimum test word length Wmin is added to the set of test word lengths.

At step S20, test word lengths of 2048, 1536, 1024, 768, 512, 2048, and 1536 are sorted in increasing order, and the test word length of 1536, which is the next shortest test word length to the minimum test word length Wmin (=1024:RAM5), is set as the minimum test word length Wmin, and the RAM macro RAM7 and the RAM macro RAM3 corresponding to the minimum test word length Wmin are set as the minimum word length RAM macros Mmin.

With the operation so far, the RAM macro RAM6, the RAM macro RAM7, the RAM macro RAM4, and the RAM macro RAM3 to be simultaneously tested at the fourth stage are set in the set of fourth-stage test-target RAM macros.

Figure 10:
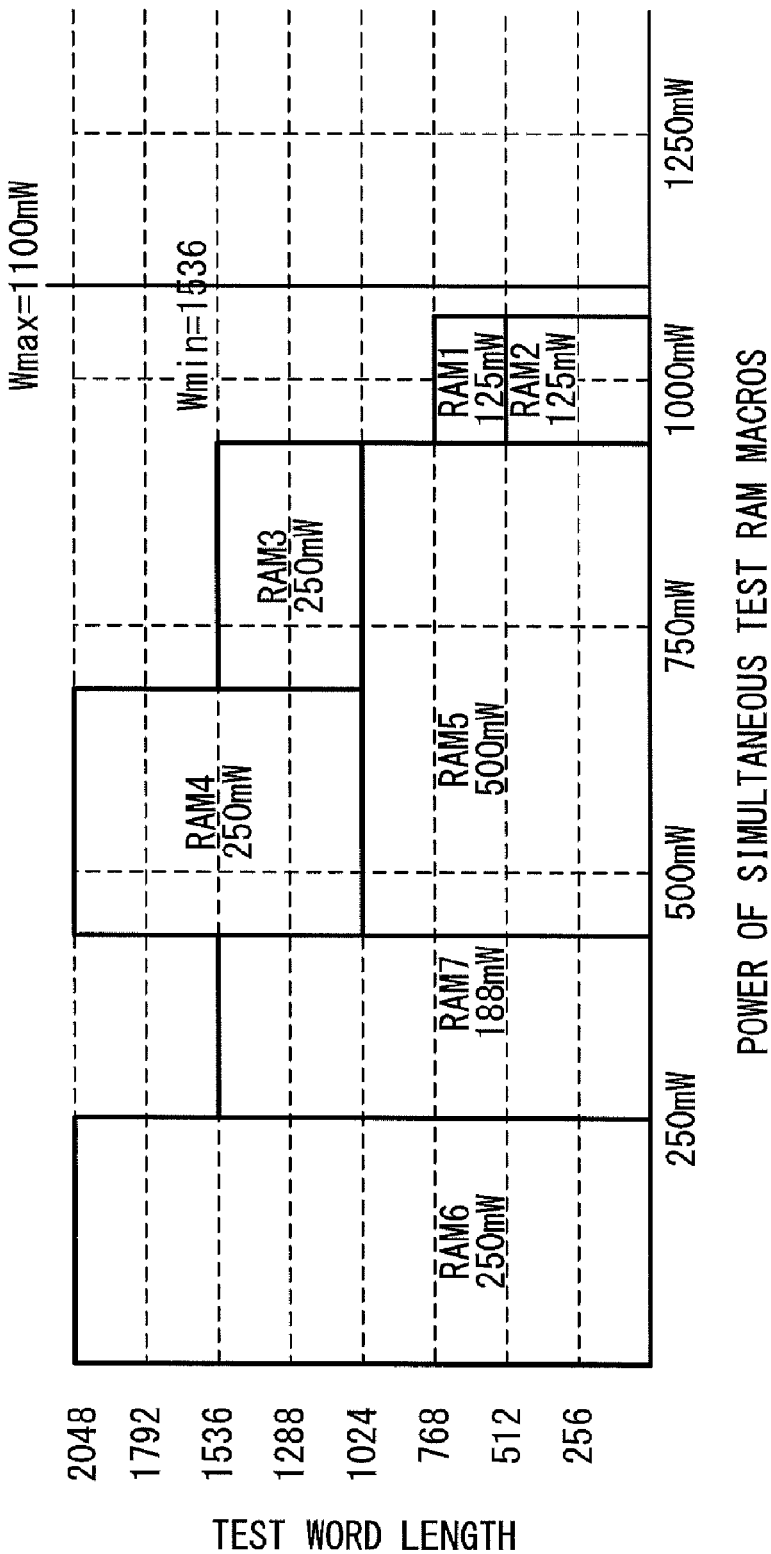
FIG. 10 is a graph showing power at the time of a memory simultaneous test.

FIG. 10 shows the word length and the power of each of the plurality of RAM macros belonging to the set of fourth-stage test-target RAM macros. The plurality of rectangles is arranged in an area represented by the following equation:

$$y \geq Wmin'.$$

Here, the minimum test word length Wmin' represents the minimum test word length Wmin when the set of third-stage test-target RAM macros is set.

The graph of FIG. 10 shows that a y coordinate (1536) that is minimum among y coordinates of a plurality of positions where upper horizontal sides of the plurality of rectangles are arranged is the minimum test word length Wmin.

The graph of FIG. 10 shows that a set of y coordinates of a plurality of positions where a plurality of sides arranged in an area represented by the following equation:

$$y \geq Wmin$$

among the upper horizontal sides of the plurality of rectangles are arranged is a set of test word lengths.

The graph of FIG. 10 shows that the RAM macro RAM3 and the RAM macro RAM7 corresponding to the rectangles with the y coordinate of upper horizontal sides indicating the minimum test word length Wmin are the minimum word length RAM macros Mmin.

Next at step S10, the RAM macro RAM7 and the RAM macro RAM3 set as the minimum word length RAM macros Mmin are deleted from the RAM macro RAM6, the RAM macro RAM7, the RAM macro RAM4, and the RAM macro RAM3 set in the set of selected RAM macros. Then, 500 mW obtained by adding the powers of the RAM macro RAM6 and the RAM macro RAM4 in the set of selected RAM macros together is set as the variable Wsum1. Further, the set of selected RAM macros is written in the set of second selected RAM macros.

Next at step S11, as a result of comparing the set of RAM macros on the power table and the set of test-setting-complete RAM macros, there is no difference, and therefore the order of testing the RAM macros is determined, and the setting ends. Here, with the operation so far, the RAM macro RAM6, and the RAM macro RAM4 to be simultaneously tested at the fifth stage are set in the set of fifth-stage test-target RAM macros.

The set of first-stage test-target RAM macros, the set of second-stage test-target RAM macros, the set of third-stage test-target RAM macros, and the set of fourth-stage test-target RAM macros, which are set by the operation so far, represent the order of testing the RAM macros. Next, the test start control portion 17 of the semiconductor memory device shown in FIGS. 2 to 4 according to the present embodiment is designed and fabricated so that the plurality of RAM macros RAM1 to RAM7 can be started to be tested in that order of testing.

Figure 11:
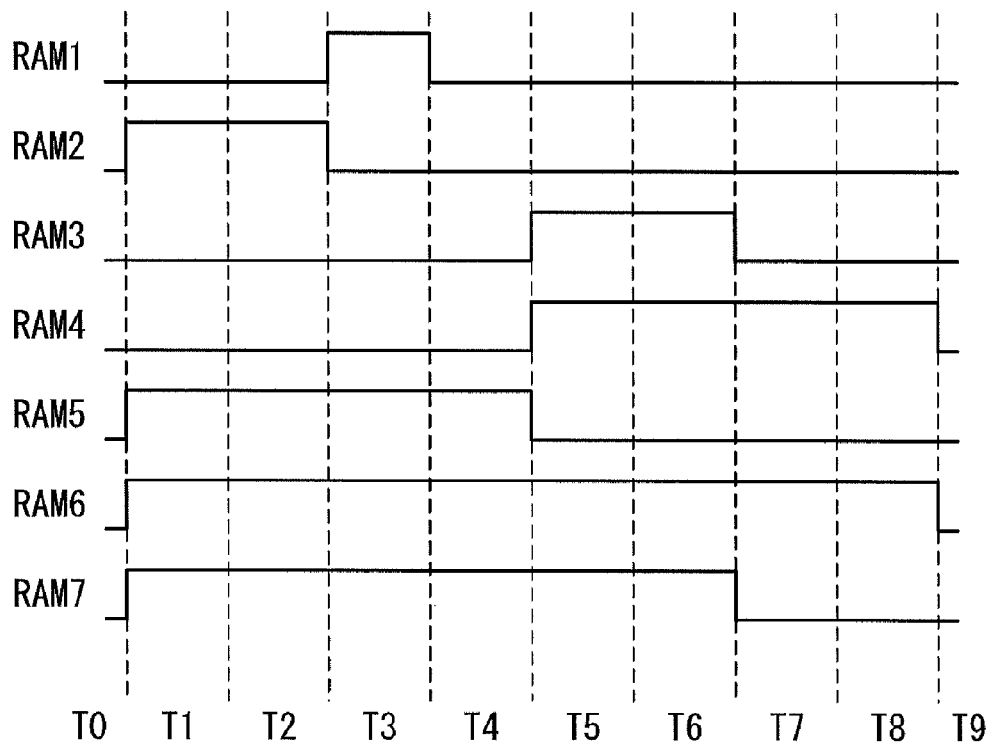
FIG. 11 is a time chart showing a memory test execution period in which each of a plurality of RAM macros is tested in an embodiment of the semiconductor memory device according to the present invention.

FIG. 11 shows the states of the plurality of RAM macros RAM1 to RAM7 during a period in which the BISTMODE signal 7 indicates that it is a test execution period in the semiconductor memory device according to the present embodiment. The period is divided into a plurality of sections T0 to T9. A state RAM1 indicates whether the RAM macro RAM1 is being tested, and also indicates that the RAM macro RAM1 is being tested in a section T3. The test execution period of the RAM macro RAM1 is the section T3. A state RAM2 indicates whether the RAM macro RAM2 is being tested, and also indicates that the RAM macro RAM2 is being tested in a section T1 to a section T2. The test execution period of the RAM macro RAM2 is the section T1 to the section T2. A state RAM3 indicates whether the RAM macro RAM3 is being tested, and also indicates that the RAM macro RAM3 is being tested in the section T5 to a section T6. The test execution period of the RAM macro RAM3 is the section T5 to the section T6. A state RAM4 indicates whether the RAM macro RAM4 is being tested, and also indicates that the RAM macro RAM4 is being tested in the section T5 to a section T8. The test execution period of the RAM macro RAM4 is the section T5 to the section T8. A state RAM5 indicates whether the RAM macro RAM5 is being tested, and also indicates that the RAM macro RAM5 is being tested in the section T1 to the section T4. The test execution period of the RAM macro RAM5 is the section T1 to the section T4. A state RAM6 indicates whether the RAM macro RAM6 is being tested, and also indicates that the RAM macro RAM6 is being tested in the section T1 to a section T8. The test execution period of the RAM macro RAM6 is the section T1 to the section T8. A state RAM7 indicates whether the RAM macro RAM7 is being tested, and also indicates that the RAM macro RAM7 is being tested in the section T1 to a section T6. The test execution period of the RAM macro RAM7 is the section T1 to the section T6. Here, the length of the test execution period of each RAM macro corresponds to the test word length of each RAM macro. FIG. 11 corresponds to FIG. 10.

The states RAM1 to RAM7 indicate that no RAM macro is being tested in the section T0. The states RAM1 to RAM7 further indicate that the RAM macro RAM2, the RAM macro RAM5, the RAM macro RAM6, and the RAM macro RAM7 are being tested in the section T1 to the section T2. The RAM macro RAM2, the RAM macro RAM5, the RAM macro RAM6, and the RAM macro RAM7 are included in the set of first-stage test-target RAM macros. The states RAM1 to RAM7 further indicate that the RAM macro RAM1, the RAM macro RAMS, the RAM macro RAM6, and the RAM macro RAM7 are being tested in the section T3. The RAM macro RAM1, the RAM macro RAM5, the RAM macro RAM6, and the RAM macro RAM7 are included in the set of second-stage test-target RAM macros. The states RAM1 to RAM7 further indicate that the RAM macro RAM5, the RAM macro RAM6, and the RAM macro RAM7 are being tested in the section T4. The RAM macro RAM5, the RAM macro RAM6, and the RAM macro RAM7 are included in the set of third-stage test-target RAM macros. The states RAM1 to RAM7 further indicate that the RAM macro RAM3, the RAM macro RAM4, the RAM macro RAM6, and the RAM macro RAM7 are being tested in the section T5 to the section T6. The RAM macro RAM3, the RAM macro RAM4, the RAM macro RAM6, and the RAM macro RAM7 are included in the set of fourth-stage test-target RAM macros. The states RAM1 to RAM7 further indicate that the RAM macro RAM4 and the RAM macro RAM6 are being tested in the section T7 to the section T8. The RAM macro RAM4, and the RAM macro RAM6 are included in the set of fifth-stage test-target RAM macros. The states RAM1 to RAM7 further indicate that no RAM macro is being tested in the section T9.

Figure 12:
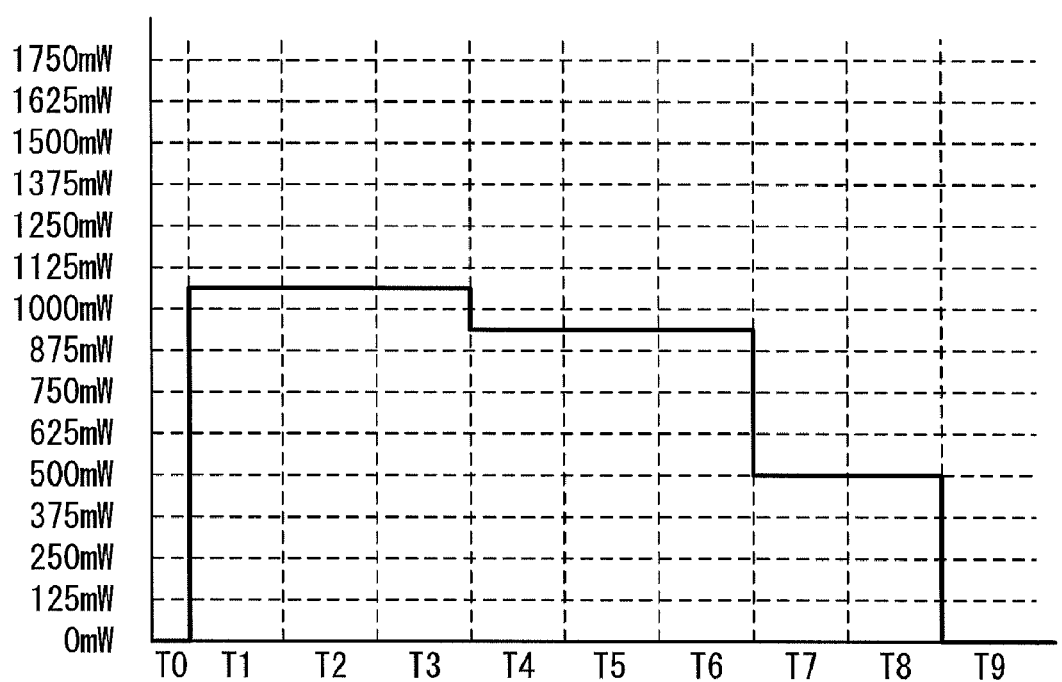
FIG. 12 is a graph showing changes in power consumed when the plurality of RAM macros is tested in the embodiment of the semiconductor memory device according to the present invention.

FIG. 12 shows changes in power consumed during each period when the BISTMODE signal 7 indicates that it is the test execution period in the semiconductor memory device according to the present embodiment. The changes 61 represents that the power consumed in the section T0 is 0 mW. The changes 61 further represents that the power consumed in the sections T1 to T3 is 1063 mW. The changes 61 further represents that the power consumed in the section T4 to the section T6 is 938 mW. The changes 61 further represents that the power consumed in the section T7 to the section T8 is 500 mW. The changes 61 further represents that the power consumed in the section T9 is 0 mW. The changes 61 further represents that the maximum value of the power among all of the section T1 to the section T8 is 1063 mW, and the power is equal to or smaller than the allowable maximum power Wmax (1.1 W). That is, the changes 61 represents that the characteristic of the semiconductor memory device according to the present embodiment is not deteriorated at the time of testing.

A comparison example of the semiconductor memory device according to the present invention includes seven RAM blocks RAM1 to RAM7 similarly to the above-described example. The RAM block 3-1 has a RAM macro 34 (hereinafter referred to as "RAM macro RAM1") associated with a word length of 256 words and a power of 125 mW. The RAM block 3-2 has a RAM macro 34 (hereinafter referred to as "RAM macro RAM2") associated with a word length of 512 words and a power of 125 mW. The RAM block 3-3 has a RAM macro 34 (hereinafter referred to as "RAM macro RAMS") associated with a word length of 512 words and a power of 250 mW. The RAM block 3-4 has a RAM macro 34 (hereinafter referred to as "RAM macro RAM4") associated with a word length of 1024 words and a power of 250 mW. The RAM block 3-5 has a RAM macro 34 (hereinafter referred to as "RAM macro RAMS") associated with a word length of 1024 words and a power of 500 mW. The RAM block 3-6 has a RAM macro 34 (hereinafter referred to as "RAM macro RAM6") associated with a word length of 2048 words and a power of 250 mW. The RAM block 3-7 has a RAM macro 34 (hereinafter referred to as "RAM macro RAM7") associated with a word length of 1536 words and a power of 188 mW. Furthermore, the semiconductor memory device of the comparison example is designed so that an allowable maximum power Wmax that can be supplied by a power-supply wiring is 1.1 W. Furthermore, a test start control portion 17 of the semiconductor memory device in the comparison example is designed so that the plurality of RAM macros RAM1 to RAM7 are started to be tested simultaneously.

Figure 13:
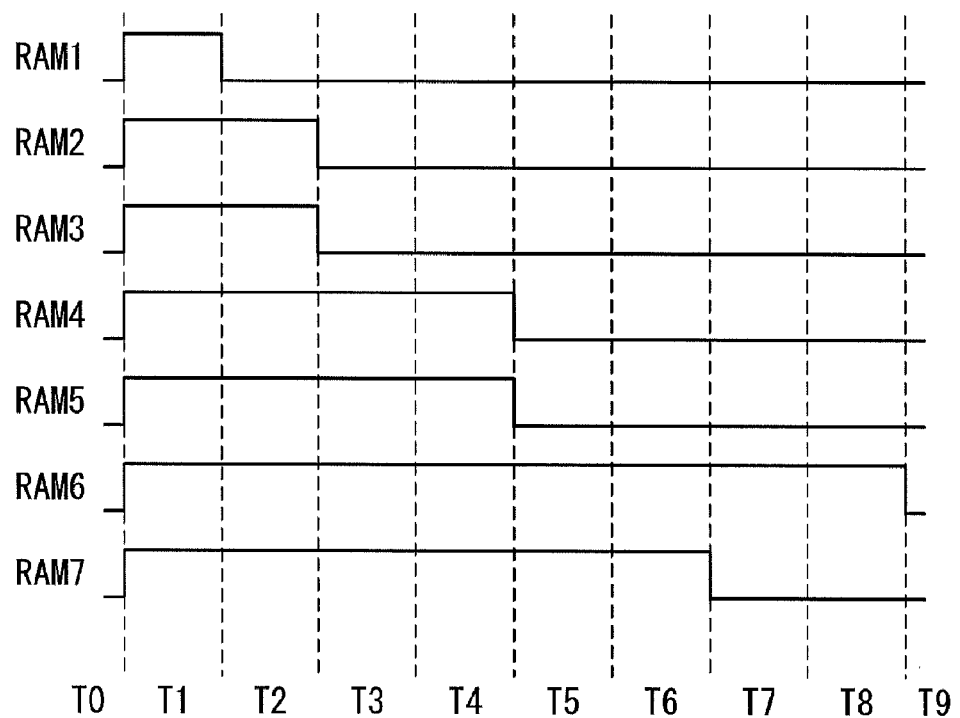
FIG. 13 is a time chart showing a memory test execution period in which each of a plurality of RAM macros is tested in a comparison example of the semiconductor memory device.

FIG. 13 shows the states of a plurality of RAM macros RAM1 to RAM7 in a period in which the BISTMODE signal 7 indicates a test execution period in the semiconductor memory device of the comparison example. The state RAM1 indicates that the RAM macro RAM1 is being tested in a section T1. The state RAM2 indicates that the RAM macro RAM2 is being tested in the section T1 to a section T2. The state RAM3 indicates that the RAM macro RAM3 is being tested in the section T1 to the section T2. The state RAM4 indicates that the RAM macro RAM4 is being tested in the section T1 to a section T4. The state RAMS indicates that the RAM macro RAMS is being tested in the section T1 to the section T4. The state RAM6 indicates that the RAM macro RAM6 is being tested in the section T1 to a section T8. The state RAM7 indicates that the RAM macro RAM7 is being tested in the section T1 to a section T6.

The states RAM1 to RAM7 indicate that no RAM macro is being tested in the section T0. The states RAM1 to RAM7 further indicate that all of the RAM macros RAM1 to RAM7 are being tested in the section T1. The states RAM1 to RAM7 further indicate that the RAM macro RAM2, the RAM macro RAM3, the RAM macro RAM4, the RAM macro RAMS, the RAM macro RAM6, and the RAM macro RAM7 are being tested in the section T2. The states RAM1 to RAM7 further indicate that the RAM macro RAM4, the RAM macro RAMS, the RAM macro RAM6, and the RAM macro RAM7 are being tested in the section T3 to the section T4. The states RAM1 to RAM7 further indicate that the RAM macro RAM6 and the RAM macro RAM7 are being tested in the section T5 to the section T6. The states RAM1 to RAM7 further indicate that the RAM macro RAM6 is being tested in the section T7 to the section T8. The states RAM1 to RAM1 further indicate that no RAM macro is being tested in the section T9.

Figure 14:
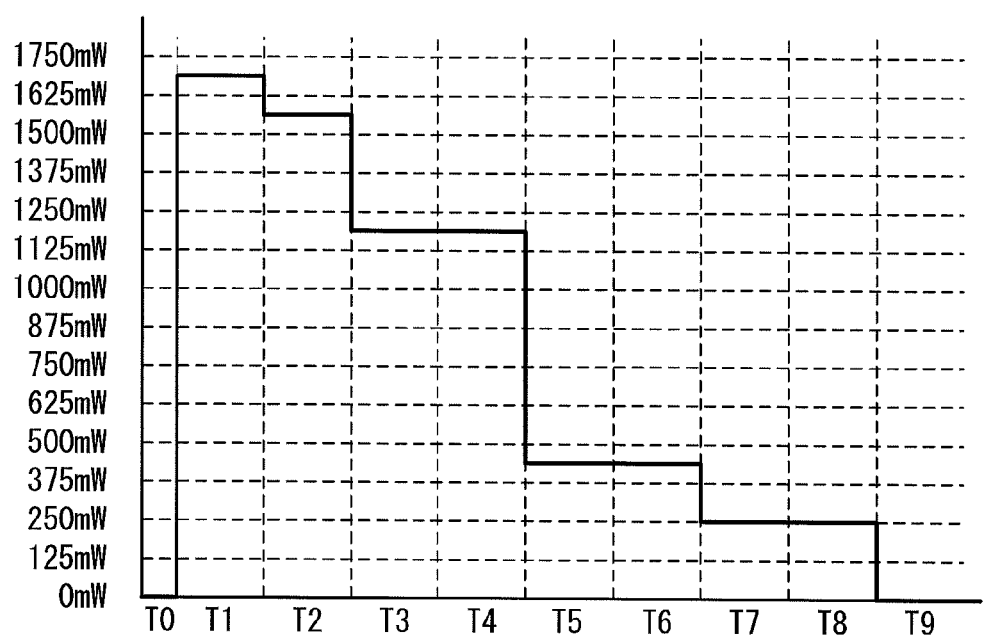
FIG. 14 is a graph showing changes in power consumed when the plurality of RAM macros is tested in the comparison example of the semiconductor memory device.

FIG. 14 shows changes in power consumed during each period when the BISTMODE signal 7 indicates that it is the test execution period in the semiconductor memory device of the comparison example. The changes 62 represents that the power consumed in a section T0 is 0 mW. The changes 62 further represents that the power consumed in a section T1 is 1688 mW. The changes 62 further represents that the power consumed in a section T2 is 1563 mW. The changes 62 further represents that the power consumed in a section T3 to a section T4 is 1188 mW. The changes 62 further represents that the power consumed in a section T5 to a section T6 is 438 mW. The changes 62 further represents that the power consumed in a section T7 to a section T8 is 250 mW. The changes 62 further represents that the power consumed in a section T9 is 0 mW.

The changes 62 further represents that the power in all section T1 to the section T8 has a maximum value of 1688 mW, and the power exceeds an allowable maximum power Wmax (1.1 W). That is, the changes 62 represents that a voltage drop is increased during a test compared with the case at the time of a normal operation in the semiconductor memory device of the comparison example. As a result, the operation speed and the minimum operation voltage characteristic deteriorate more than that in the case of a mode of a normal operation.

That is, the semiconductor memory device of the example can prevent the occurrence of characteristic deterioration at the time of testing even when a plurality of RAM macros in which consumption power exceeds an allowable maximum power when these RAM macros are tested simultaneously is included.

Here, the algorithm shown in FIGS. 6A to 6D can be replaced by another algorithm of calculating a plurality of memory test execution periods so that the plurality of RAM macros are tested at a power smaller than a predetermined power (the allowable maximum power Wmax). In an example of the algorithm, the plurality of memory test execution periods are calculated so that the plurality of RAM macros are tested at a power smaller than a predetermined power (the allowable maximum power Wmax) and also the testing of all the plurality of RAM macros ends in the shortest time. A semiconductor memory device to which the above-described algorithm is applied can prevent, as with the above-described semiconductor memory device 1, the occurrence of characteristic deterioration at the time of testing.

It is apparent that the present invention is not limited to the above embodiment, but may be modified and changed without departing from the scope and spirit of the invention.

Although the present invention has been described above in connection with several exemplary embodiments thereof, it would be apparent to those skilled in the art that those exemplary embodiments are provided solely for illustrating the present invention, and should not be relied upon to construe the appended claims in a limiting sense.

What is claimed is:

1. A semiconductor memory device comprising:
a plurality of RAM macros; and
a test control circuit configured to correlate said plurality of RAM macros with a plurality of memory test execution periods,
wherein said test control circuit outputs control signals to said plurality of RAM macros such that one RAM macro of said plurality of RAM macros is tested during one memory test execution period of said plurality of memory test execution periods, said one RAM macro being correlated with said one memory test execution period,
wherein said plurality of RAM macros is correlated with a plurality of powers,
wherein said plurality of memory test execution periods is set such that, when a plurality of simultaneous test RAM macros in said plurality of RAM macros is simultaneously tested, the sum of powers supplied to said plurality of simultaneous test RAM macros in said plurality of powers is smaller than the maximum power possible to be supplied to said plurality of RAM macros,
wherein said plurality of memory test execution periods is further set such that said plurality of RAM macros is tested to minimize an amount of time for testing.

2. A memory test method comprising:
obtaining a power table correlating a plurality of RAM macros with a plurality of powers, each power of the plurality of powers being a power consumed when a respective of the RAM macros is operated;
calculating a plurality of memory test execution periods correlated with said plurality of RAM macros based on said power table; and
testing said plurality of RAM macros such that one RAM macro of said plurality of RAM macros is tested during one memory test execution period of said plurality of memory test execution periods, said one RAM macro being correlated with said one memory test execution period.

3. The memory test method according to claim 2, further comprising:
obtaining a predetermined power,
wherein said calculating step includes:
calculating said plurality of memory test execution periods such that, when a plurality of simultaneous test RAM macros in said plurality of RAM macros is simultaneously tested, the sum of powers supplied to said plurality of simultaneous test RAM macros in said plurality of powers is smaller than said predetermined power.

4. The memory test method according to claim 3, wherein said power table further correlates said plurality of RAM macros with a plurality of word lengths, and
wherein said calculating step includes:
calculating said plurality of memory test execution periods based on said power table including said plurality of word lengths.

5. The memory test method according to claim 4, wherein said calculating step includes:

calculating said plurality of memory test execution periods such that, when two powers of said plurality of powers correlated with two RAM macros of said plurality of RAM macros are equal to each other, one of said two RAM macros, whose word length is larger than that of the other, is tested first.

6. The memory test method according to claim 3, wherein said predetermined power is the maximum power possible to be supplied to said plurality of RAM macros.

7. A non-transitory computer-readable medium including a computer program comprising code operable to control a computer for a designing method of a semiconductor memory device, the code comprising instructions for:
 creating a power table correlating a plurality of RAM macros with a plurality of powers, each power of the plurality of powers being a power consumed when a respective of the RAM macros is operated;
 calculating a plurality of memory test execution periods correlated with said plurality of RAM macros based on said power table; and
 designing a test control circuit controlling test for said plurality of RAM macros such that one RAM macro of said plurality of RAM macros is tested during one memory test execution period of said plurality of memory test execution periods, said one RAM macro being correlated with said one memory test execution period.

8. The non-transitory computer-readable medium according to claim 7, further comprising:
 obtaining a predetermined power,
 wherein said calculating step includes:
 calculating said plurality of memory test execution periods such that, when a plurality of simultaneous test RAM macros in said plurality of RAM macros is simultaneously tested, the sum of powers supplied to said plurality of simultaneous test RAM macros in said plurality of powers is smaller than said predetermined power.

9. The non-transitory computer-readable medium according to claim 8, wherein said creating step includes:
 creating said power table further correlating said plurality of RAM macros with a plurality of word lengths, and
 wherein said calculating step includes:
 calculating said plurality of memory test execution periods based on said power table including said plurality of word lengths.

10. The non-transitory computer-readable medium according to claim 9, wherein said calculating step includes:
 calculating said plurality of memory test execution periods such that, when two powers of said plurality of powers correlated with two RAM macros of said plurality of RAM macros are equal to each other, one of said two RAM macros, whose word length is larger than that of the other, is tested first.

11. The non-transitory computer-readable medium according to claim 8, wherein said predetermined power is the maximum power possible to be supplied to said plurality of RAM macros.

* * * * *